United States Patent
Yamazaki

(10) Patent No.: US 8,878,173 B2
(45) Date of Patent: Nov. 4, 2014

(54) SEMICONDUCTOR DEVICE INCLUDING OXIDE SEMICONDUCTOR AND METAL OXIDE

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 205 days.

(21) Appl. No.: 13/171,029

(22) Filed: Jun. 28, 2011

(65) Prior Publication Data

US 2012/0001170 A1 Jan. 5, 2012

(30) Foreign Application Priority Data

Jul. 2, 2010 (JP) ................... 2010-152342

(51) Int. Cl.
*H01L 29/12* (2006.01)
*H01L 29/786* (2006.01)
*H01L 29/66* (2006.01)
*H01L 27/12* (2006.01)

(52) U.S. Cl.
CPC ......... *H01L 29/7869* (2013.01); *H01L 27/1225* (2013.01); *H01L 29/66742* (2013.01); *H01L 29/78606* (2013.01)
USPC .......................................................... 257/43

(58) Field of Classification Search
USPC .......................................................... 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| CN | 1934711 A | 3/2007 |
| EP | 1 737 044 A1 | 12/2006 |

(Continued)

OTHER PUBLICATIONS

International Search Report, PCT Application No. PCT/JP2011/064601, dated Oct. 4, 2011, 2 pages.

(Continued)

*Primary Examiner* — Kevin Parendo
(74) *Attorney, Agent, or Firm* — Fish & Richardson P.C.

(57) ABSTRACT

An object is to provide a semiconductor device including an oxide semiconductor, which has stable electrical characteristics and improved reliability. In a transistor including an oxide semiconductor film, insulating films each including a material containing a Group 13 element and oxygen are formed in contact with the oxide semiconductor film, whereby the interfaces with the oxide semiconductor film can be kept in a favorable state. Further, the insulating films each include a region where the proportion of oxygen is higher than that in the stoichiometric composition, so that oxygen is supplied to the oxide semiconductor film; thus, oxygen defects in the oxide semiconductor film can be reduced. Furthermore, the insulating films in contact with the oxide semiconductor film each have a stacked structure so that films each containing aluminum are provided over and under the oxide semiconductor film, whereby entry of water into the oxide semiconductor film can be prevented.

20 Claims, 15 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,642,573 B2 | 1/2010 | Hoffman et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,838,348 B2 | 11/2010 | Hoffman et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199881 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1* | 12/2008 | Akimoto et al. ............ 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0078634 A1 | 4/2010 | Hoffman et al. |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |
| 2011/0101335 A1 | 5/2011 | Yamazaki et al. |
| 2011/0193083 A1 | 8/2011 | Kim et al. |
| 2011/0240990 A1 | 10/2011 | Yamazaki |
| 2011/0281394 A1 | 11/2011 | Yamazaki |
| 2011/0303914 A1 | 12/2011 | Yamazaki |
| 2011/0309456 A1 | 12/2011 | Yamazaki |
| 2011/0312127 A1 | 12/2011 | Ishizuka et al. |
| 2012/0119205 A1 | 5/2012 | Taniguchi et al. |

FOREIGN PATENT DOCUMENTS

| | | |
|---|---|---|
| EP | 2 141 743 A1 | 1/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073698 A | 3/2007 |
| JP | 2007-529118 A | 10/2007 |
| JP | 2009-231613 A | 10/2009 |
| JP | 2010-016347 A | 1/2010 |
| JP | 2010-016348 A | 1/2010 |
| JP | 2010-067954 A | 3/2010 |
| WO | 2004/114391 A1 | 12/2004 |
| WO | 2005/093849 A1 | 10/2005 |

OTHER PUBLICATIONS

Written Opinion, PCT Application No. PCT/JP2011/064601, dated Oct. 4, 2011, 4 pages.

Sang-Hee Ko Park et al.; "21.1: Effect of Channel/Insulator Interface Formation Process on the Oxide TFT Performance"; SID Digest '09: SID International Symposium Digest of Technical Papers; May 31, 2009; pp. 276-279; vol. 40.

(56) References Cited

OTHER PUBLICATIONS

Toshiaki Arai et al.; "69.2: Highly Reliable Oxide-Semiconductor TFT for AM-OLED Display"; SID Digest '10: SID International Symposium Digest of Technical Papers; May 23, 2010; pp. 1033-1036; vol. 41.
Doo-Hee Cho et al.; "21.2: Al and Sn-doped Zinc Indium Oxide Thin Film Transistors for AMOLED Back-Plane"; SID Digest '09: SID International Symposium Digest of Technical Papers; May 31, 2009; pp. 280-283; vol. 40.
Minki Ryu et al.; "31-4: Photon-Enhanced Bias Instability of InGaZnO TFT with Dual Gate Structure"; IMID/IDMC/ASIA Display 2010 Digest; Oct. 2010; pp. 222-223.
Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology,"IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing $MOO_3$ as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas." The Electrochemical Society, 214th ECS Meeting, 2008, No. 2317, 1 page.
Kimizuka, N et al., "Spinel,$YbFe_2O_4$, and $Yb_2Fe_3O_7$ Types of Structures for Compounds in the $In_2O_3$ and $Sc_2O_3$-$A_2O_3$-BO Systems [a; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits, 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar., 1995, vol. 150, pp. 1-4 with English translation.

Nakamura, M et al., "The phase relations in the $In_2O_3$—$Ga_2ZnO_4$—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13. 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al.. "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE INCLUDING OXIDE SEMICONDUCTOR AND METAL OXIDE

TECHNICAL FIELD

The present invention relates to a semiconductor device and a method for manufacturing the semiconductor device.

In this specification, a semiconductor device generally means a device which operates by utilizing semiconductor characteristics, and an electrooptic device, a semiconductor circuit, and electronic equipment are all semiconductor devices.

BACKGROUND ART

A technique by which transistors are formed using semiconductor thin films over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor whose active layer uses an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

DISCLOSURE OF INVENTION

However, electrical conductivity of the oxide semiconductor may potentially change in the following case: the oxide semiconductor has deviation from the stoichiometric composition because of oxygen vacancy; a factor such as hydrogen or water causing formation of an electron donor enters the oxide semiconductor in a manufacturing process of a device; or the like. Such a phenomenon becomes a cause of variation in the electric characteristics of a semiconductor device such as a transistor, including the oxide semiconductor.

In view of the above problem, an object is to provide a semiconductor device including an oxide semiconductor, which has stable electrical characteristics and improved reliability.

In one embodiment of the disclosed invention, insulating films each including a material containing a Group 13 element and oxygen are formed in contact with an oxide semiconductor film, whereby the interfaces with the oxide semiconductor film can be kept in a favorable state. Further, the insulating films each include a region where the proportion of oxygen is higher than that in the stoichiometric composition, so that oxygen is supplied to the oxide semiconductor film; thus, oxygen defects in the oxide semiconductor film can be reduced. Furthermore, the insulating films in contact with the oxide semiconductor film each have a stacked structure so that films each containing aluminum are provided over and under the oxide semiconductor film, whereby entry of water into the oxide semiconductor film can be prevented. Specifically, structures described below can be employed, for example.

One embodiment of the present invention is a semiconductor device including a gate electrode; a gate insulating film covering the gate electrode and having a stacked structure of a first metal oxide film and a second metal oxide film; an oxide semiconductor film provided in contact with the second metal oxide film and in a region overlapping with the gate electrode; a source electrode and a drain electrode which are electrically connected to the oxide semiconductor film; a third metal oxide film in contact with the oxide semiconductor film; and a fourth metal oxide film in contact with the third metal oxide film. The first metal oxide film, the second metal oxide film, the third metal oxide film, and the fourth metal oxide film each contain a Group 13 element and oxygen.

In the above semiconductor device, a conductive layer may be provided over the fourth metal oxide film and in a region overlapping with the oxide semiconductor film.

Another embodiment of the present invention is a semiconductor device including a first metal oxide film; a second metal oxide film on and in contact with the first metal oxide film; an oxide semiconductor film in contact with the second metal oxide film; a source electrode and a drain electrode which are electrically connected to the oxide semiconductor film; a gate insulating film having a stacked structure of a third metal oxide film in contact with the oxide semiconductor film and a fourth metal oxide film on and in contact with the third metal oxide film; and a gate electrode provided over the gate insulating film and in a region overlapping with the oxide semiconductor film. The first metal oxide film, the second metal oxide film, the third metal oxide film, and the fourth metal oxide film each contain a Group 13 element and oxygen.

In any one of the above semiconductor devices, the second metal oxide film and the third metal oxide film are preferably at least partly in contact with each other.

In any one of the above semiconductor devices, the first metal oxide film, the second metal oxide film, the third metal oxide film, and the fourth metal oxide film each preferably include a region where the proportion of oxygen is higher than that in the stoichiometric composition.

In any one of the above semiconductor devices, the first metal oxide film and the fourth metal oxide film preferably each contain one of aluminum oxide and aluminum gallium oxide.

In any one of the above semiconductor devices, the second metal oxide film and the third metal oxide film preferably each contain one of gallium oxide and gallium aluminum oxide.

Note that the ordinal numbers such as "first" and "second" in this specification are used for convenience and do not denote the order of steps and the stacking order of layers. In addition, the ordinal numbers in this specification do not denote particular names which specify the present invention.

According to one embodiment of the present invention, a transistor having stable electrical characteristics is provided.

Further, according to one embodiment of the present invention, a semiconductor device which includes a transistor having excellent electrical characteristics and high reliability can be provided.

BEST MODE FOR CARRYING OUT THE INVENTION

Hereinafter, embodiments of the present invention will be described in detail with reference to the accompanying drawings. Note that the present invention is not limited to the following description, and it will be easily understood by those skilled in the art that modes and details disclosed herein can be modified in various ways. Therefore, the present invention is not construed as being limited to description of the embodiments below.

[Embodiment 1]

In this embodiment, one embodiment of a semiconductor device and a method for manufacturing the semiconductor device will be described with reference to FIGS. 1A to 1C, FIGS. 2A to 2C, FIGS. 3A to 3C, FIGS. 4A to 4F, FIGS. 5A to 5E, and FIGS. 6A to 6E.

<Example of Structure of Semiconductor Device>

Figure 1A:
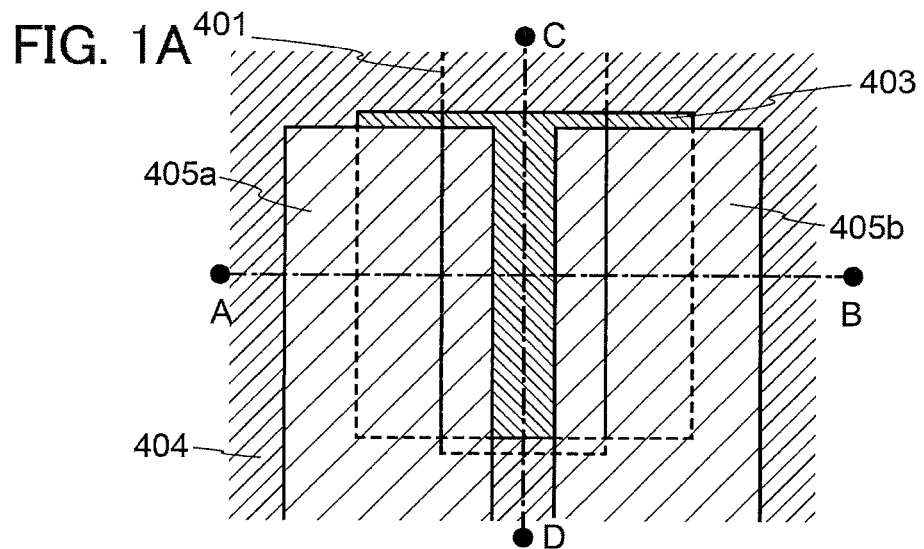
FIGS. 1A to 1C are a plan view and cross-sectional views illustrating one embodiment of a semiconductor device.
Figure 1B:
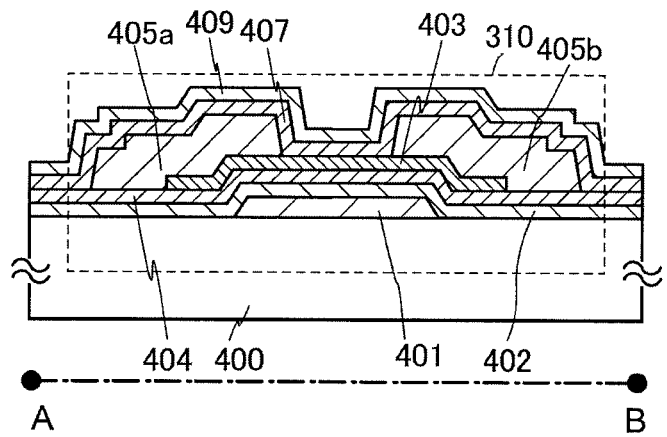
Figure 1C:
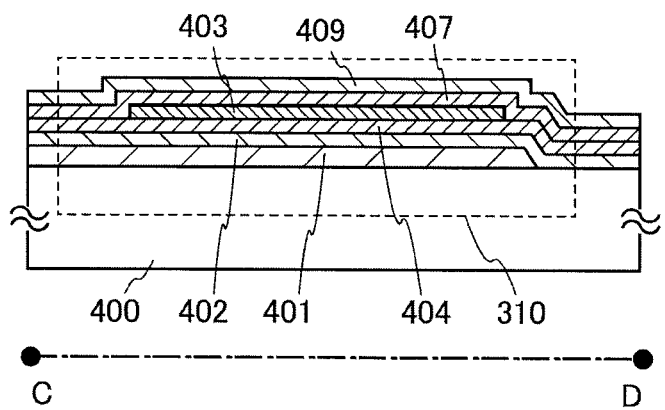

FIGS. 1A to 1C are a plan view and cross-sectional views of a transistor 310 as an example of a semiconductor device according to one embodiment of the disclosed invention. In FIGS. 1A to 1C, a bottom-gate transistor is illustrated as a transistor according to one embodiment of the disclosed invention. Here, FIG. 1A is a plan view and FIGS. 1B and 1C are cross-sectional views taken along line A-B and line C-D, respectively, of FIG. 1A. Note that part of components of the transistor 310 (e.g., a third metal oxide film 407, a fourth metal oxide film 409, and the like) is omitted in FIG. 1A for brevity.

The transistor 310 in FIGS. 1A to 1C includes, over a substrate 400 having an insulating surface, a gate electrode 401, a gate insulating film including a first metal oxide film 402 and a second metal oxide film 404, an oxide semiconductor film 403, a source electrode 405a, a drain electrode 405b, the third metal oxide film 407, and the fourth metal oxide film 409.

In the transistor 310 illustrated in FIGS. 1A to 1C, the third metal oxide film 407 is provided so as to cover the source electrode 405a and the drain electrode 405b and to be in contact with the second metal oxide film 404 and the oxide semiconductor film 403. Further, in the transistor 310 illustrated in FIGS. 1A to 1C, the third metal oxide film 407 and the second metal oxide film 404 are in contact with each other in a region where the oxide semiconductor film 403 is not provided. That is, the oxide semiconductor film 403 is surrounded by the second metal oxide film 404 and the third metal oxide film 407.

Here, the oxide semiconductor film 403 is preferably a highly-purified oxide semiconductor film formed by sufficiently removing an impurity such as hydrogen or water or sufficiently supplying oxygen. Specifically, the hydrogen concentration in the oxide semiconductor film 403 is $5\times10^{19}$ atoms/cm$^3$ or lower, preferably $5\times10^{18}$ atoms/cm$^3$ or lower, further preferably $5\times10^{17}$ atoms/cm$^3$ or lower. Note that the hydrogen concentration in the oxide semiconductor film 403 is measured by secondary ion mass spectroscopy (SIMS). In the oxide semiconductor film 403 which is highly purified by sufficiently reducing the hydrogen concentration and in which defect levels in the energy gap due to oxygen vacancy are decreased by supplying a sufficient amount of oxygen, the carrier concentration is lower than $1\times10^{12}$/cm$^3$, preferably lower than $1\times10^{11}$/cm$^3$, further preferably lower than $1.45\times10^{10}$/cm$^3$. With an i-type oxide semiconductor formed as described above, a transistor having excellent electrical characteristics can be obtained.

As for the second metal oxide film 404 and the third metal oxide film 407 each of which is in contact with the oxide semiconductor film 403, an insulating film containing oxygen is preferable, and a film including a region where the proportion of oxygen is higher than that in the stoichiometric composition (such a region is also referred to as an oxygen-excess region) is further preferable. When the second metal oxide film 404 and the third metal oxide film 407 each of which is in contact with the oxide semiconductor film 403 include an oxygen-excess region, oxygen can be prevented from transferring from the oxide semiconductor film 403 to the second metal oxide film 404 or the third metal oxide film 407. Further, oxygen can be supplied to the oxide semiconductor film 403 from the second metal oxide film 404 or the third metal oxide film 407. Thus, the oxide semiconductor film 403 sandwiched between the second metal oxide film 404 and the third metal oxide film 407 can be a film containing a sufficient amount of oxygen.

Many of oxide semiconductor materials used for the oxide semiconductor film 403 contain a Group 13 element. Therefore, the second metal oxide film 404 or the third metal oxide film 407 each of which is in contact with the oxide semiconductor film 403 is formed with the use of a material containing a Group 13 element and oxygen; thus, the interface with the oxide semiconductor film can be kept in a favorable state. This is because a material containing a Group 13 element and oxygen is compatible with an oxide semiconductor material.

For example, in the case where an oxide semiconductor film containing gallium is formed, a material containing gallium oxide is used for the second metal oxide film 404 or the third metal oxide film 407; thus, favorable characteristics can be kept at the interface between the oxide semiconductor film and the metal oxide film which is in contact with the oxide semiconductor film. When the oxide semiconductor film and the metal oxide film containing gallium oxide are provided in contact with each other, pileup of hydrogen (accumulation of hydrogen) at the interface between the oxide semiconductor film and the metal oxide film can be reduced. Note that a similar effect can be obtained in the case where an element in the same group as a constituent element of the oxide semiconductor is used. That is, it is also effective to form the second metal oxide film 404 or the third metal oxide film 407 with the use of a material containing aluminum oxide or the like. Note that aluminum oxide has a property of not easily transmitting water. Thus, it is preferable to use a material containing aluminum oxide in terms of preventing entry of water to the oxide semiconductor film.

The second metal oxide film 404 or the third metal oxide film 407 may include two kinds or more of Group 13 elements. For example, gallium aluminum oxide (or aluminum gallium oxide) which contains gallium and aluminum described above or the like may be used for the second metal oxide film 404 or the third metal oxide film 407. In this case, both an effect derived from containing gallium and an effect derived from containing aluminum can be obtained, which is preferable. For example, the oxide semiconductor film and a metal oxide film containing gallium and aluminum are provided in contact with each other, whereby entry of water into the oxide semiconductor film can be prevented and pileup of hydrogen (including a hydrogen ion) at the interface between the oxide semiconductor film and the metal oxide film can be sufficiently reduced.

Here, aluminum gallium oxide refers to a material in which the amount of aluminum is larger than that of gallium in atomic percent, and gallium aluminum oxide refers to a material in which the amount of gallium is larger than that of aluminum in atomic percent.

Since the electronegativity of aluminum is lower than that of gallium, aluminum easily absorbs hydrogen as compared with gallium in some cases. Therefore, a gallium oxide film or a gallium aluminum oxide film having a large amount of gallium is preferably used for the metal oxide film in contact with the oxide semiconductor film, in order to suppress pileup of hydrogen at the interface with the oxide semiconductor film.

Further, the second metal oxide film 404 and the third metal oxide film 407 are preferably formed using the same material, because the adhesiveness between the second metal oxide film 404 and the third metal oxide film 407 can be increased when a structure is employed in which they are in contact with each other in a region where the oxide semiconductor film 403 is not provided. In addition, it is further preferable that the composition ratio of the second metal oxide film 404 be equal to that of the third metal oxide film 407. Alternatively, in the case where the second or third metal oxide film is formed using a gallium oxide film or a gallium aluminum oxide film, the preferable composition of gallium oxide or gallium aluminum oxide is represented by $Ga_xAl_{2-x}O_{3+\alpha}$ ($1<x\leq2$, $0<\alpha<1$).

In the transistor 310, the first metal oxide film 402 is a film over which the second metal oxide film 404 is stacked, which functions as the gate insulating film. Further, in the transistor 310, the fourth metal oxide film 409 is a film under which the third metal oxide film 407 is stacked, which functions as a protective film. The first metal oxide film 402 and the fourth metal oxide film 409 are formed with the use of a material containing a Group 13 element and oxygen, whereby the interfaces with the second metal oxide film 404 and with the third metal oxide film 407 can be kept in a favorable state. Note that as described above, since water hardly penetrates aluminum oxide, an aluminum gallium oxide film having a large amount of aluminum is preferably used as the first or fourth metal oxide film which is provided under or over the transistor 310 in order to prevent entry of water into the oxide semiconductor film.

Further, each of the first metal oxide film 402 and the fourth metal oxide film 409 preferably includes a region where the proportion of oxygen is higher than that in the stoichiometric composition. Oxygen is supplied to the oxide semiconductor film 403 or the metal oxide film in contact with the oxide semiconductor film 403, so that oxygen defects in the oxide semiconductor film 403 or at the interface between the oxide semiconductor film 403 and the metal oxide film in contact with the oxide semiconductor film 403 can be suppressed. For example, in the case where the first or fourth metal oxide film is formed using an aluminum gallium oxide film, the preferable composition of aluminum gallium oxide is represented by $Ga_xAl_{2-x}O_{3+\alpha}$ ($0<x<1$, $0<\alpha<1$).

In the case where an oxide semiconductor film without defects (oxygen defects) is used, the first to fourth metal oxide films each preferably contain oxygen whose proportion corresponds to that in the stoichiometric composition. However, in order to obtain reliability of the transistor, such as suppression of shift in the threshold voltage, a larger amount of oxygen is preferably contained in the metal oxide films so that the proportion of oxygen can be higher than that in the stoichiometric composition; otherwise oxygen deficiency may occur in the oxide semiconductor film.

An insulator may further be formed over the transistor 310. Further, an opening may be formed in the first to fourth metal oxide films or the like so that the source electrode 405a and the drain electrode 405b which are electrically connected to the oxide semiconductor film 403 can be electrically connected to a wiring. Note that it is not always necessary but desirable to process the oxide semiconductor film 403 into an island shape.

Figure 2A:
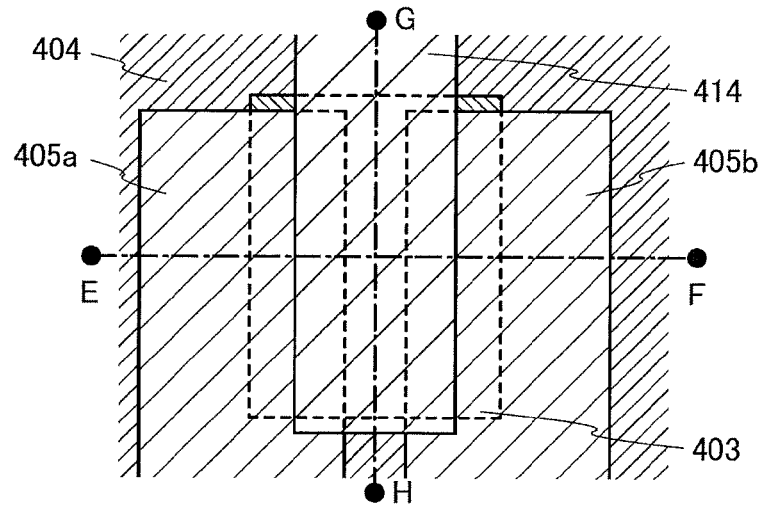
FIGS. 2A to 2C are a plan view and cross-sectional views illustrating one embodiment of a semiconductor device.
Figure 2B:
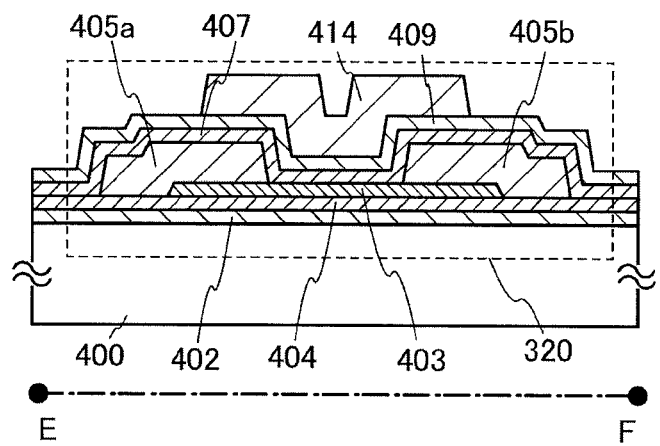
Figure 2C:
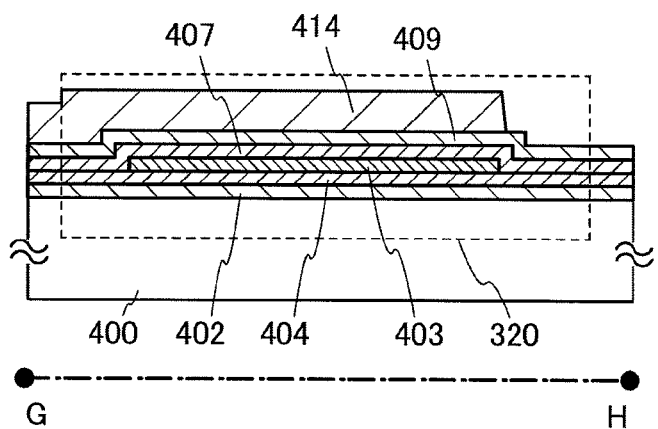

FIGS. 2A to 2C are a plan view and cross-sectional views of a transistor 320 which has a different structure from the transistor 310. In FIGS. 2A to 2C, a top-gate transistor is illustrated as a transistor according to one embodiment of the disclosed invention. Here, FIG. 2A is a plan view and FIGS. 2B and 2C are cross-sectional views taken along line E-F and line G-H, respectively, of FIG. 2A. Note that part of components of the transistor 320 (e.g., the third metal oxide film 407, the fourth metal oxide film 409, and the like) is omitted in FIG. 2A for brevity.

The transistor 320 illustrated in FIGS. 2A to 2C includes, over the substrate 400 having an insulating surface, the first metal oxide film 402, the second metal oxide film 404, the oxide semiconductor film 403, the source electrode 405a, the drain electrode 405b, a gate insulating film including the third metal oxide film 407 and the fourth metal oxide film 409, and a gate electrode 414.

In the transistor 320 illustrated in FIGS. 2A to 2C, the third metal oxide film 407 is provided so as to cover the source electrode 405a and the drain electrode 405b and be in contact with part of the second metal oxide film 404 and the oxide semiconductor film 403. In the transistor 320 illustrated in FIGS. 2A to 2C, the third metal oxide film 407 and the second metal oxide film 404 are in contact with each other in a region where the oxide semiconductor film 403 is not provided, as in the transistor 310 illustrated in FIGS. 1A to 1C. In other words, the oxide semiconductor film 403 is surrounded by the second metal oxide film 404 and the third metal oxide film 407. The other components are the same as those of the transistor 310 in FIGS. 1A to 1C; thus, the description of FIGS. 1A to 1C can be referred to for the details.

Figure 3A:
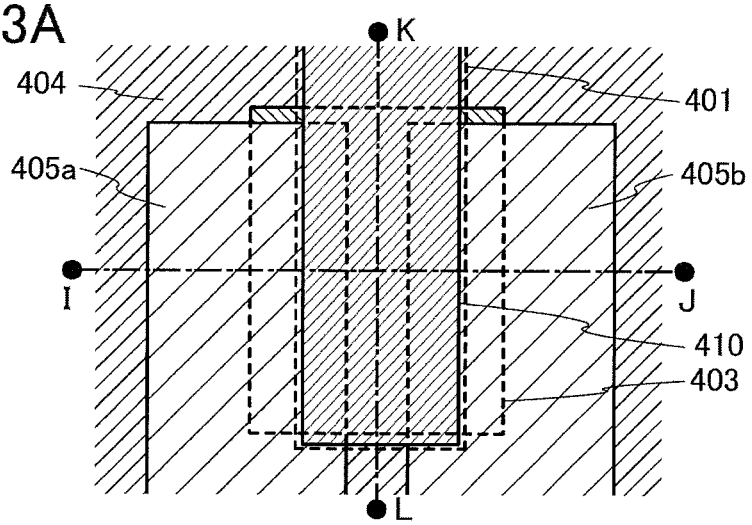
FIGS. 3A to 3C are a plan view and cross-sectional views illustrating one embodiment of a semiconductor device.
Figure 3B:
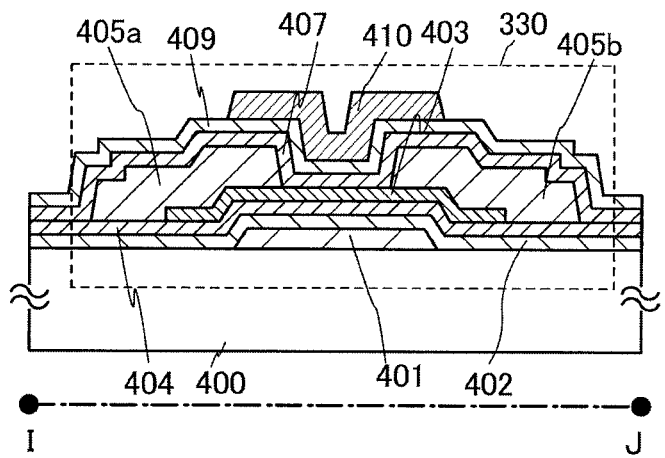
Figure 3C:
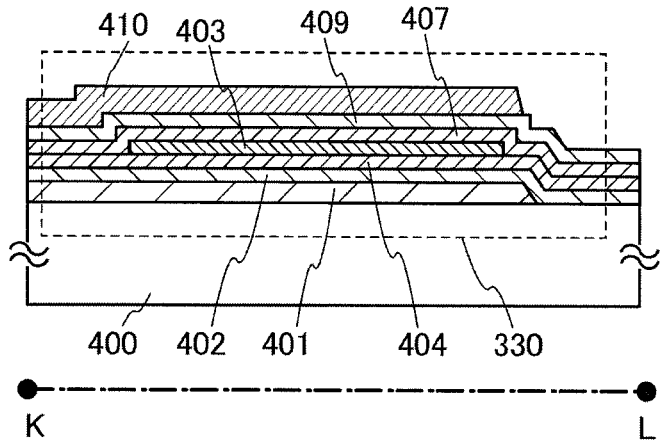

FIGS. 3A to 3C are a plan view and cross-sectional views of a transistor 330 which has a different structure from the transistor 310 and the transistor 320. Here, FIG. 3A is a plan view, and FIGS. 3B and 3C are cross-sectional views taken along line I-J and line K-L, respectively, of FIG. 3A. Note that part of components of the transistor 330 (e.g., the third metal oxide film 407, the fourth metal oxide film 409, and the like) is omitted in FIG. 3A for brevity.

The transistor 330 illustrated in FIGS. 3A to 3C includes, over the substrate 400 having an insulating surface, the gate electrode 401, a gate insulating film including the first metal oxide film 402 and the second metal oxide film 404, the oxide semiconductor film 403, the source electrode 405a, the drain electrode 405b, the third metal oxide film 407, the fourth metal oxide film 409, and a conductive layer 410 provided in a region overlapping with the oxide semiconductor film 403.

In the transistor 330 illustrated in FIGS. 3A to 3C, the third metal oxide film 407 is provided so as to cover the source electrode 405a and the drain electrode 405b and be in contact with the second metal oxide film 404 and the oxide semiconductor film 403. In the transistor 330 illustrated in FIGS. 3A to 3C, the third metal oxide film 407 and the second metal oxide film 404 are in contact with each other in a region where the oxide semiconductor film 403 is not provided, as in the transistor 310 illustrated in FIGS. 1A to 1C. In other words, the oxide semiconductor film 403 is surrounded by the second metal oxide film 404 and the third metal oxide film 407.

In the transistor 330, the conductive layer 410 can function as a second gate electrode. In that case, the third metal oxide film 407 and the fourth metal oxide film 409 function as a gate insulating film. The other components are the same as those of the transistor 310 in FIGS. 1A to 1C; thus, the description of FIGS. 1A to 1C can be referred to for the details.

FIGS. 4A to 4F are cross-sectional views of transistors which have different structures from the above transistors. Note that the structures of FIGS. 4A to 4F can be combined with any of the structures of FIGS. 1A to 1C, FIGS. 2A to 2C, and FIGS. 3A to 3C as appropriate.

Figure 4A:
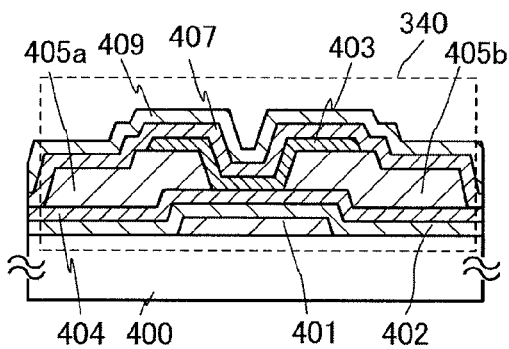
FIGS. 4A to 4F are cross-sectional views each illustrating one embodiment of a semiconductor device.

Like the transistor 310, a transistor 340 illustrated in FIG. 4A includes, over the substrate 400 having an insulating surface, the gate electrode 401, a gate insulating film including the first metal oxide film 402 and the second metal oxide film 404, the oxide semiconductor film 403, the source electrode 405a, the drain electrode 405b, the third metal oxide film 407, and the fourth metal oxide film 409. A different between the transistor 340 and the transistor 310 is a position where the oxide semiconductor film 403 is connected to the source electrode 405a and the drain electrode 405b. That is, in the transistor 340, a bottom of the oxide semiconductor film 403 is in contact with the source electrode 405a and the drain electrode 405b. The other components are the same as those of the transistor 310 in FIGS. 1A to 1C; thus, the description of FIGS. 1A to 1C can be referred to for the details.

Figure 4B:
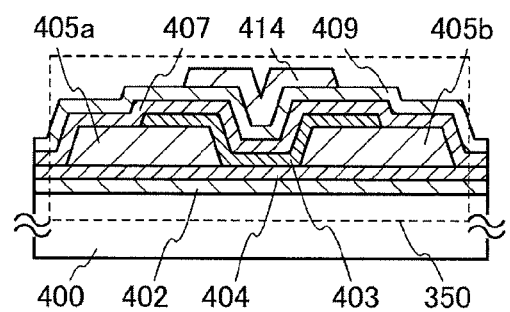

Like the transistor 320, a transistor 350 illustrated in FIG. 4B includes, over the substrate 400 having an insulating surface, the first metal oxide film 402, the second metal oxide film 404, the oxide semiconductor film 403, the source electrode 405a, the drain electrode 405b, a gate insulating film including the third metal oxide film 407 and the fourth metal oxide film 409, and the gate electrode 414. A different between the transistor 350 and the transistor 320 is a position where the oxide semiconductor film 403 is connected to the source electrode 405a and the drain electrode 405b. That is, in the transistor 350, a bottom of the oxide semiconductor film 403 is in contact with the source electrode 405a and the drain electrode 405b. The other components are the same as those of the transistor 320 in FIGS. 2A to 2C; thus, the description of FIGS. 2A to 2C can be referred to for the details.

Figure 4C:
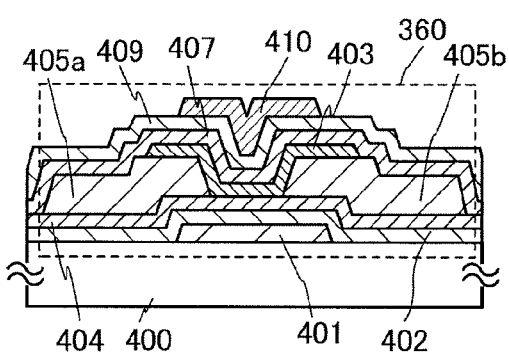

Like the transistor 330, a transistor 360 illustrated in FIG. 4C includes, over the substrate 400 having an insulating surface, the gate electrode 401, a gate insulating film including the first metal oxide film 402 and the second metal oxide film 404, the oxide semiconductor film 403, the source electrode 405a, the drain electrode 405b, the third metal oxide film 407, the fourth metal oxide film 409, and the conductive layer 410 provided in a region overlapping with the oxide semiconductor film 403. A different between the transistor 360 and the transistor 330 is a position where the oxide semiconductor film 403 is connected to the source electrode 405a and the drain electrode 405b. That is, in the transistor 360, a bottom of the oxide semiconductor film 403 is in contact with the source electrode 405a and the drain electrode 405b. The other components are the same as those of the transistor 330 in FIGS. 3A to 3C; thus, the description of FIGS. 3A to 3C can be referred to for the details.

Figure 4D:
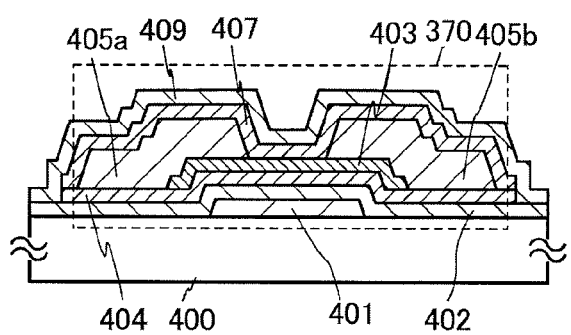

Like the transistor 310, a transistor 370 illustrated in FIG. 4D includes, over the substrate 400 having an insulating surface, the gate electrode 401, a gate insulating film including the first metal oxide film 402 and the second metal oxide film 404, the oxide semiconductor film 403, the source electrode 405a, the drain electrode 405b, the third metal oxide film 407, and the fourth metal oxide film 409. The transistor 370 is different from the transistor 310 in that the third metal oxide film 407 and the second metal oxide film 404 are in contact with each other and the first metal oxide film 402 and the fourth metal oxide film 409 are in contact with each other in a region where the oxide semiconductor film 403 is not provided. In the transistor 370, the oxide semiconductor film 403 is surrounded by not only the second metal oxide film 404 and the third metal oxide film 407 but also the first metal oxide film 402 and the fourth metal oxide film 409; therefore, incorporation of impurities such as hydrogen or moisture can be further prevented. Note that the structure of the transistor 370 illustrated in FIG. 4D can be formed by, for example, patterning the third metal oxide film 407 and the second metal oxide film 404 after the third metal oxide film 407 is formed. The first metal oxide film 402 and the second metal oxide film 404 are preferably formed using materials with which etching selectively can be obtained. The other components are the same as those of the transistor 310 in FIGS. 1A to 1C; thus, the description of FIGS. 1A to 1C can be referred to for the details.

Figure 4E:
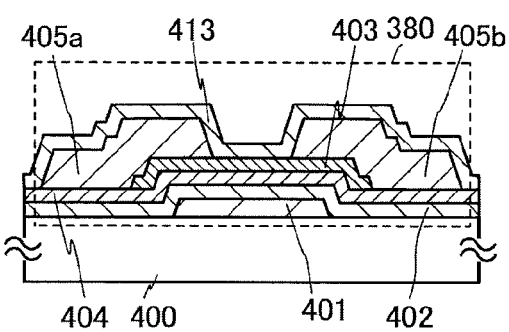
Figure 4F:
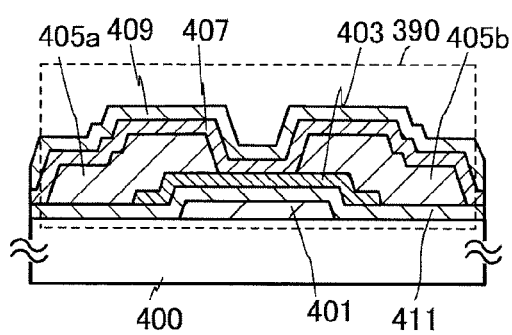

Note that the number of the metal oxide films provided over the oxide semiconductor film 403 is not necessarily limited to two. Similarly, the number of the metal oxide films provided under the oxide semiconductor film 403 is not necessarily limited to two. For example, a transistor 380 illustrated in FIG. 4E is an example of having a single-layer structure of a metal oxide film 413 instead of a stacked structure of the third metal oxide film 407 and the fourth metal oxide film 409 in the transistor 310. A transistor 390 illustrated in FIG. 4F is an example of having a single-layer structure of a metal oxide film 411 instead of a stacked structure of the first metal oxide film 402 and the second metal oxide film 404 in the transistor 310. The metal oxide film 413 or the metal oxide film 411 can be formed using a material containing a Group 13 element and oxygen. For example, a material containing one or more of gallium oxide, aluminum oxide, aluminum gallium oxide, and gallium aluminum oxide can be used. Like the above first to fourth metal oxide films, the metal oxide film 413 or the metal oxide film 411 preferably includes an oxygen-excess region. The other components are the same as those of the transistor 310 in FIGS. 1A to 1C; thus, the description of FIGS. 1A to 1C can be referred to for the details.

<Example of Manufacturing Process of Transistor>

Hereinafter, a manufacturing process of a transistor according to this embodiment will be described with reference to FIGS. 5A to 5E and FIGS. 6A to 6E.

<Manufacturing Process of Transistor 330>

An example of a manufacturing process of the transistor 330 in FIGS. 3A to 3C will be described with reference to FIGS. 5A to 5E. Note that the transistor 310 illustrated in FIGS. 1A to 1C has a structure in which the conductive layer 410 is omitted from the transistor 330, and can be formed in a manner similar to that of the transistor 330 except for the conductive layer 410.

First, a conductive film is formed over the substrate 400 having an insulating surface, and then, the gate electrode 401 is formed through a first photolithography step. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least heat resistance high enough to withstand heat treatment to be performed later. For example, a substrate such as a glass substrate, a ceramic substrate, a quartz substrate, or a sapphire substrate can be used. As long as the substrate 400 has an insulating surface, a single crystal semiconductor substrate or a polycrystalline semiconductor substrate of silicon, carbon silicon, or the like; a compound semiconductor substrate of silicon germanium or the like; an SOI substrate; or the like can be used, and a semiconductor element may be provided over the substrate. A flexible substrate may be used as the substrate 400.

An insulating film serving as a base film may be provided between the substrate 400 and the gate electrode 401. The base film has a function of preventing diffusion of an impurity element from the substrate 400, and can be formed with a single-layer structure or a stacked structure using one or more of a silicon nitride film, a silicon oxide film, a silicon nitride oxide film, and a silicon oxynitride film.

In addition, the gate electrode 401 can be formed to have a single-layer structure or a stacked structure using any of metal materials such as molybdenum, titanium, tantalum, tungsten, aluminum, copper, neodymium, and scandium, or an alloy material which contains any of these materials as a main component.

Next, the first metal oxide film 402 is formed over the gate electrode 401. The first metal oxide film 402 can be formed using a material containing a Group 13 element and oxygen. For example, a material containing one or more of gallium oxide, aluminum oxide, aluminum gallium oxide, and gallium aluminum oxide can be used. Note that an aluminum gallium oxide film is preferably used as the first metal oxide film 402 in order that the interface with the second metal oxide film 404 formed later can be kept in a favorable state and entry of water into the oxide semiconductor film can be prevented.

In addition to a Group 13 element, an impurity element other than hydrogen, e.g., a Group 3 element such as yttrium, a Group 4 element such as hafnium, a Group 14 element such as silicon, nitrogen, or the like can be contained in the first metal oxide film 402. Such an impurity element is contained at about higher than 0% and lower than or equal to 20 atomic %, for example, whereby an energy gap of the first metal oxide film 402 can be controlled with the additive amount of the element.

The first metal oxide film 402 is preferably formed by using a method with which an impurity such as water or hydrogen does not enter the first metal oxide film 402. If an impurity such as hydrogen or water is contained in the first metal oxide film 402, an impurity such as hydrogen or water may enter the oxide semiconductor film to be formed later or may cause extraction of oxygen in the oxide semiconductor film. As a result, resistance of the oxide semiconductor film is reduced (the oxide semiconductor film is to be an n-type oxide semiconductor film) and a parasitic channel may be formed. For example, the first metal oxide film 402 is preferably formed by a sputtering method. A high-purity gas from which an impurity such as hydrogen or water is removed is preferable for a sputtering gas used in film formation.

As a sputtering method, a DC sputtering method using a direct-current power supply, a pulsed DC sputtering method in which a DC bias is applied in a pulsed manner, an AC sputtering method, or the like can be used.

Note that in the case where an aluminum gallium oxide film or a gallium aluminum oxide film is formed as the first metal oxide film 402, a gallium oxide target to which an aluminum particle is added may be applied as a target used in a sputtering method. Using a gallium oxide target to which an aluminum particle is added can make conductivity of the target increase; thus, discharge during sputtering can be facilitated. With such a target, a metal oxide film suitable for mass production can be manufactured.

Next, treatment for supplying oxygen is preferably performed on the first metal oxide film 402. As the treatment for supplying oxygen, heat treatment in an oxygen atmosphere, oxygen doping treatment, and the like can be given. Alternatively, oxygen may be added by performing irradiation with oxygen ions accelerated by an electric field. Note that in this specification and the like, "oxygen doping treatment" means addition of oxygen to a bulk, and the term "bulk" is used in order to clarify that oxygen is added not only to a surface of a thin film but also to the inside of the thin film. In addition, "oxygen doping" includes "oxygen plasma doping" in which oxygen that is made to be plasma is added to a bulk.

Treatment for supplying oxygen such as oxygen doping treatment is performed on the first metal oxide film 402, whereby a region where the proportion of oxygen is higher than that in the stoichiometric composition is formed in the first metal oxide film 402. Providing such a region allows oxygen to be supplied to the second metal oxide film or the oxide semiconductor film which are formed later, and accordingly, oxygen defects in the oxide semiconductor film or in the interface between the oxide semiconductor film and the second metal oxide film can be suppressed.

Alternatively, an oxygen gas or a mixed gas containing an inert gas (e.g., nitrogen or a rare gas such as argon) and oxygen is introduced during the deposition of the first metal oxide film 402 by a sputtering method, whereby an oxygen-excess region can be formed in the first metal oxide film 402. Note that after the deposition by a sputtering method, heat treatment may be performed.

For example, in the case where an aluminum gallium oxide film is used as the first metal oxide film 402, treatment for supplying oxygen such as oxygen doping treatment is performed; thus, the composition of aluminum gallium oxide can be $Ga_xAl_{2-x}O_{3+\alpha}$ (0<x<1, 0<α<1).

Figure 5A:
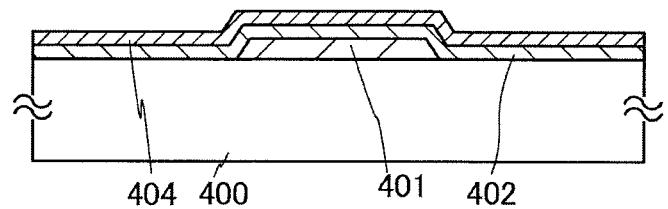
FIGS. 5A to 5E illustrate an example of a manufacturing process of a semiconductor device.

Next, the second metal oxide film 404 is formed over the first metal oxide film 402 (FIG. 5A). Thus, the gate insulating film (first gate insulating film) including the first metal oxide film 402 and the second metal oxide film 404 is formed. The second metal oxide film 404 can be formed using a material containing a Group 13 element and oxygen. For example, a material containing one or more of gallium oxide, aluminum oxide, aluminum gallium oxide, and gallium aluminum oxide can be used. As described above, in order to keep a favorable state at the interface with the oxide semiconductor film formed later and to suppress pileup of hydrogen at the interface with the oxide semiconductor film, a gallium aluminum oxide film is preferably used as the second metal oxide film 404.

Like the first metal oxide film 402, the second metal oxide film 404 may contain an impurity element other than hydrogen, e.g., a Group 3 element such as yttrium, a Group 4 element such as hafnium, a Group 14 element such as silicon, nitrogen, or the like in addition to a Group 13 element.

The second metal oxide film 404 is preferably formed by using a method with which an impurity such as hydrogen or water does not enter the second metal oxide film 404. For example, a sputtering method can be used. The details are similar to those of the first metal oxide film 402; thus, the method for forming the first metal oxide film 402 can be referred to.

Next, treatment for supplying oxygen is preferably performed on the second metal oxide film 404. As the treatment for supplying oxygen, heat treatment in an oxygen atmosphere, oxygen doping treatment, and the like can be given. Alternatively, oxygen may be added by performing irradiation with oxygen ions accelerated by an electric field.

Alternatively, an oxygen gas or a mixed gas containing an inert gas (e.g., nitrogen or a rare gas such as argon) and oxygen may be introduced during the deposition of the second metal oxide film 404 by a sputtering method in order to supply oxygen to the second metal oxide film 404. For example, a gallium oxide film is deposited under the following condition: the distance between the substrate and the target is 60 mm; the pressure is 0.4 Pa; the RF power source is 1 kW; the deposition temperature is room temperature; the flow rate of an argon gas is 25 sccm; and the flow rate of an oxygen gas is 25 sccm. The deposition temperature may be set to, for example, 400° C., without being limited to room temperature. Further, the flow rate of the oxygen gas may be set to 50 sccm without the argon gas being introduced. Furthermore, after the deposition by a sputtering method, heat treatment (at a temperature higher than or equal to 450° C. and lower than or equal to 650° C. for one hour in ultra-dry air, for example) may be performed. By such a deposition method, a gallium oxide film in which the proportion of oxygen is higher than that in the stoichiometric composition can be formed; thus, the composition of gallium oxide can be $Ga_2O_{3+\alpha}$ ($0<\alpha<1$, e.g., $0.32\leq\alpha\leq0.48$).

Treatment for supplying oxygen (hereinafter, also referred to as oxygen supply treatment) such as oxygen doping treatment is performed on the second metal oxide film 404, whereby a region where the proportion of oxygen is higher than that in the stoichiometric composition is formed in the second metal oxide film 404. Providing such a region allows oxygen to be supplied to the oxide semiconductor film which is formed later, and accordingly, oxygen defects in the oxide semiconductor film or the interface between the oxide semiconductor film and the second metal oxide film can be reduced. Note that the oxygen supply treatment performed on the second metal oxide film 404 may also serve as the above oxygen supply treatment performed on the first metal oxide film 402.

In the case where a gallium oxide film or a gallium aluminum oxide film is used as the second metal oxide film 404, oxygen supply treatment such as oxygen doping treatment is preferably performed; thus, the composition of gallium oxide or gallium aluminum oxide can be $Ga_xAl_{2-x}O_{3+\alpha}$ ($1<x\leq2$, $0<\alpha<1$).

Next, the oxide semiconductor film 403 is formed to a thickness greater than or equal to 3 nm and less than or equal to 30 nm over the second metal oxide film 404 by a sputtering method. The thickness in the above range is preferable because when the thickness of the oxide semiconductor film 403 is too large (for example, when the thickness is 50 nm or more), the transistor might be normally on. Note that the first metal oxide film 402, the second metal oxide film 404, and the oxide semiconductor film 403 are preferably formed successively without being exposed to the air.

Examples of oxide semiconductors used for the oxide semiconductor film 403 include an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and In—Ga—O-based oxide semiconductor which are oxides of two metal elements; an In—O-based oxide semiconductor; a Sn—O-based oxide semiconductor; and a Zn—O-based oxide semiconductor. In addition, $SiO_2$ may be contained in the above oxide semiconductor. Note that here, for example, an In—Ga—Zn—O-based oxide semiconductor means an oxide semiconductor film containing indium (In), gallium (Ga), and zinc (Zn) and there is no particular limitation on the composition ratio. The In—Ga—Zn—O-based oxide semiconductor may contain an element other than In, Ga, and Zn.

As the oxide semiconductor film 403, a thin film formed using a material expressed by a chemical formula of $InMO_3(ZnO)_m$ ($m>0$) can be used. Here, M represents one or more metal elements selected from Ga, Al, Mn, and Co. For example, Al can be Ga, Ga and Al, Ga and Mn, Ga and Co, or the like.

In the case where an In—Zn—O-based material is used as the oxide semiconductor film 403, a composition ratio of a target is In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor, an atomic ratio is In:Zn:O=X:Y:Z, and the relation, $Z>1.5X+Y$, is satisfied.

In this embodiment, the oxide semiconductor film 403 is formed by a sputtering method with the use of an In—Ga—Zn—O-based target. Further, the oxide semiconductor film 403 can be formed by a sputtering method in a rare gas (typically, argon) atmosphere, an oxygen atmosphere, or a mixed atmosphere of a rare gas and oxygen.

As a target used for forming an In—Ga—Zn—O film as the oxide semiconductor film 403 by a sputtering method, for example, a target having the following composition ratio may be used: $In_2O_3$:$Ga_2O_3$:ZnO is 1:1:1 [molar ratio]. Further, a material and a composition of the target are not limited to the above. For example, a target having the following composition may be used: $In_2O_3$:$Ga_2O_3$:ZnO is 1:1:2 [molar ratio].

Further, the filling rate of the target is higher than or equal to 90% and lower than or equal to 100%, preferably higher than or equal to 95% and lower than or equal to 99.9%. With the use of a target with high filling rate, the resulting oxide semiconductor film 403 has high density.

It is preferable that a high-purity gas from which an impurity such as hydrogen, water, a hydroxyl group, or a hydride is removed be used as the sputtering gas for the formation of the oxide semiconductor film 403.

For the formation of the oxide semiconductor film 403, the substrate 400 is held in a deposition chamber kept at reduced pressure and the substrate temperature is set to a temperature higher than or equal to 100° C. and lower than or equal to 600° C., preferably higher than or equal to 200° C. and lower than or equal to 400° C. The film formation is performed while the substrate 400 is heated, whereby the impurity concentration in the oxide semiconductor film 403 can be reduced. In addition, damage caused by sputtering can be reduced. Then, a sputtering gas from which an impurity such as hydrogen or moisture is sufficiently removed is introduced into the deposition chamber from which remaining moisture is being removed, so that the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom such as water ($H_2O$) (further preferably, also a compound containing a carbon atom), and the like are removed, whereby the impurity concentration in the oxide semiconductor film 403 formed in the deposition chamber can be reduced.

As an example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power supply is preferably used, in which case powder substances (also referred to as particles or dust) that are generated in deposition can be reduced and the film thickness can be uniform.

After that, heat treatment (first heat treatment) is preferably performed on the oxide semiconductor film 403. Excessive hydrogen (including water and a hydroxyl group) in the oxide semiconductor film 403 can be removed by the first heat treatment. Moreover, excessive hydrogen (including water and a hydroxyl group) in the first metal oxide film 402 and the second metal oxide film 404 can also be removed through the first heat treatment. The first heat treatment is performed at a temperature higher than or equal to 250° C. and lower than or equal to 700° C., preferably higher than or equal to 450° C. and lower than or equal to 600° C. or lower than the strain point of the substrate.

The heat treatment can be performed in such a way that, for example, an object is introduced into an electric furnace in which a resistance heating element or the like is used, and heated at 450° C. for an hour in a nitrogen atmosphere. During the heat treatment, the oxide semiconductor film 403 is not exposed to the air to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas including oxygen during the process. This is because defect levels in the energy gap due to oxygen deficiency can be decreased by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is higher than or equal to 6 N (99.9999%), preferably higher than or equal to 7 N (99.99999%) (that is, the impurity concentration is lower than or equal to 1 ppm, preferably lower than or equal to 0.1 ppm).

The above heat treatment (first heat treatment) can be referred to as dehydration treatment, dehydrogenation treatment, or the like because of its effect of removing hydrogen, water, and the like. The dehydration treatment or the dehydrogenation treatment can be performed, for example, after the oxide semiconductor film 403 is processed into an island shape. Such dehydration treatment or dehydrogenation treatment may be conducted once or plural times.

The gate insulating film (a stacked layer of the first metal oxide film 402 and the second metal oxide film 404) in contact with the oxide semiconductor film 403 has been subjected to oxygen doping treatment and accordingly includes an oxygen excess region. Thus, transfer of oxygen from the oxide semiconductor film 403 to the gate insulating film can be suppressed. In addition, the oxide semiconductor film 403 is formed in contact with the gate insulating film to which oxygen has been supplied, whereby oxygen can be supplied from the gate insulating film to the oxide semiconductor film 403. Further, when a gallium aluminum oxide film including an oxygen-excess region is foamed as the second metal oxide film 404 which is in contact with the oxide semiconductor film 403, the interface with the oxide semiconductor film 403 can be kept in a favorable state and pileup of hydrogen at the interface can be reduced. Further, when an aluminum gallium oxide film including an oxygen-excess region is formed as the first metal oxide film 402, entry of water into the oxide semiconductor film 403 can be prevented.

The oxygen supply from the gate insulating film including an oxygen-excess region to the oxide semiconductor film 403 is further promoted by performance of heat treatment in the state where the gate insulating film is in contact with the oxide semiconductor film 403. At least part of oxygen which has been added to the gate insulating film and supplied to the oxide semiconductor film 403 preferably has a dangling bond in the oxide semiconductor. This is because the dangling bond can be bonded with hydrogen left in the oxide semiconductor film to immobilize hydrogen (make hydrogen an immovable ion).

Figure 5B:
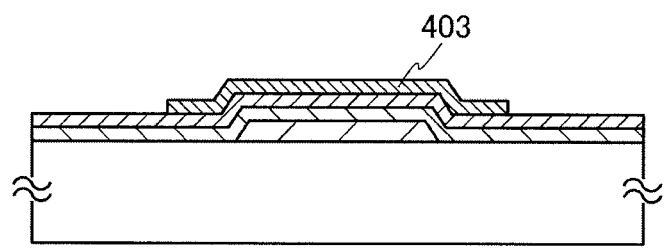

Next, the oxide semiconductor film 403 is preferably processed into the island-shape oxide semiconductor film 403 by a second photolithography step (FIG. 5B). A resist mask used for forming the island-shaped oxide semiconductor film 403 may be formed by an inkjet method. Formation of the resist mask by an inkjet method needs no photomask; thus, manufacturing cost can be reduced. For the etching of the oxide semiconductor film 403, wet etching, dry etching, or both of them may be employed.

Next, a conductive film for forming the source electrode and the drain electrode (including a wiring formed using the same layer as the source electrode and the drain electrode) is formed over the second metal oxide film 404 and the oxide semiconductor film 403. As the conductive film used for the source electrode and the drain electrode, for example, a metal film containing an element selected from Al, Cr, Cu, Ta, Ti, Mo, or W, a metal nitride film containing any of the above elements as its component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both a lower side and an upper side of a metal film of Al, Cu, or the like. Further, the conductive film used for the source electrode and the drain electrode may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

Figure 5C:
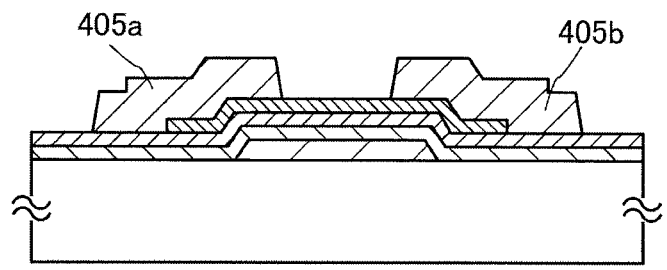

Through a third photolithography step, a resist mask is formed over the conductive film and selective etching is performed, so that the source electrode 405a and the drain electrode 405b are formed. Then, the resist mask is removed (FIG. 5C). Light exposure at the time of the formation of the resist mask in the third photolithography step may be performed using ultraviolet light, KrF laser light, or ArF laser light. The channel length L of a transistor that is to be completed later is determined by a distance between bottom edges of the source electrode 405a and the drain electrode 405b, which are adjacent to each other over the oxide semiconductor film 403. When light exposure is performed for a channel length L smaller than 25 nm, the light exposure for forming the resist mask in the third photolithography step may be performed using extreme ultraviolet light having an extremely short wavelength of several nanometers to several tens of nanometers, for example. In the light exposure by extreme ultraviolet light, the resolution is high and the focal depth is large. Thus, the channel length L of the transistor formed later can be reduced, whereby the operation speed of a circuit can be increased.

In order to reduce the number of photomasks used in a photolithography step and reduce the number of steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that when the conductive film is etched, it is desirable that the condition be optimized so that the oxide semiconductor film 403 can be prevented from being divided by etching. However, it is difficult to obtain such an etching condition under which only the conductive film is etched and the oxide semiconductor film 403 is not etched at all. In some cases, only part of the oxide semiconductor film 403, e.g., 5% to 50% in thickness of the oxide semiconductor film 403 is etched when the conductive film is etched, whereby the oxide semiconductor film 403 having a groove portion (a recessed portion) is formed.

Next, plasma treatment may be performed using a gas such as $N_2O$, $N_2$, or Ar so that water adsorbed to a surface of an exposed portion of the oxide semiconductor film 403 is removed. In the case where plasma treatment is performed, the third metal oxide film 407 which is to be in contact with the oxide semiconductor film 403 is desirably formed without being exposed to the air, following the plasma treatment.

The third metal oxide film 407 can be formed using a material and a method which are similar to those of the second metal oxide film 404. In order to keep a favorable state at the interface with the oxide semiconductor film and to suppress pileup of hydrogen at the interface with the oxide semiconductor film, the third metal oxide film 407 is preferably formed using a gallium aluminum film similarly to the second metal oxide film 404.

Next, treatment for supplying oxygen such as oxygen doping treatment is preferably performed on the third metal oxide film 407. Note that an oxygen gas or a mixed gas containing an inert gas (e.g., nitrogen or a rare gas such as argon) and oxygen may be introduced during the deposition of the third metal oxide film 407 by a sputtering method in order to supply oxygen to the third metal oxide film 407.

Figure 5D:
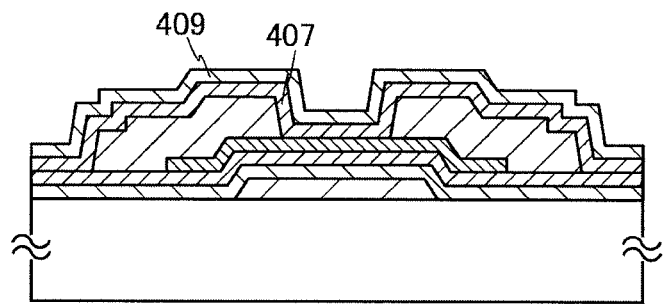
Figure 5E:
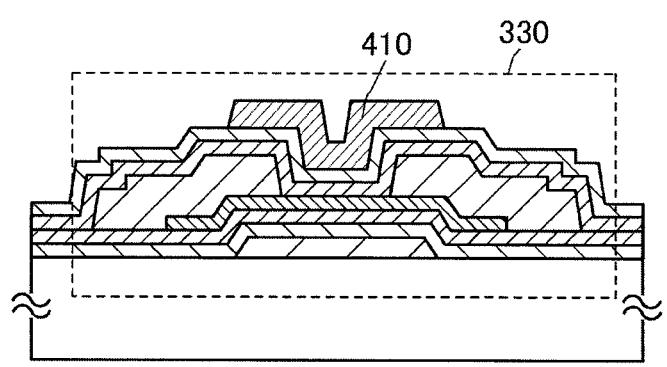

Next, the fourth metal oxide film 409 is formed over the third metal oxide film 407 (FIG. 5D). In the transistor 330, the third metal oxide film 407 and the fourth metal oxide film 409 function as the gate insulating film (second gate insulating film). The fourth metal oxide film 409 can be formed using a material and a method which are similar to those of the first metal oxide film 402. Note that an aluminum gallium oxide film is preferably used as the fourth metal oxide film 409 in order to keep a favorable state at the interface with the third metal oxide film 407 and to prevent entry of water into the oxide semiconductor film.

Next, treatment for supplying oxygen is preferably performed on the fourth metal oxide film 409. Note that an oxygen gas or a mixed gas containing an inert gas (e.g., nitrogen or a rare gas such as argon) and oxygen may be introduced during the deposition of the fourth metal oxide film 409 by a sputtering method in order to supply oxygen to the fourth metal oxide film 409. Note that the treatment for supplying oxygen to the fourth metal oxide film 409 may also serve as the treatment for supplying oxygen to the third metal oxide film 407.

After that, second heat treatment is preferably performed in the state where part of the oxide semiconductor film 403 (channel formation region) is in contact with the third metal oxide film 407. The second heat treatment is performed at a temperature higher than or equal to 250° C. and lower than or equal to 700° C., preferably higher than or equal to 450° C. and lower than or equal to 600° C. or lower than the strain point of the substrate.

The second heat treatment may be performed in an atmosphere of nitrogen, oxygen, ultra-dry air (air in which a water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, a rare gas, or the like. It is also preferable that the purity of nitrogen, oxygen, or the rare gas which is introduced into the heat treatment apparatus be set to be 6N (99.9999%) or higher, preferably 7N (99.99999%) or higher (that is, the impurity concentration is 1 ppm or lower, preferably 0.1 ppm or lower).

The second heat treatment is performed in the state where the oxide semiconductor film 403 is in contact with the second metal oxide film 404 and the third metal oxide film 407 each including an oxygen-excess region. Thus, oxygen which is one of main components of the oxide semiconductor and might be reduced due to the dehydration (or dehydrogenation) treatment can be supplied from at least one of the second metal oxide film 404 and the third metal oxide film 407 each containing oxygen to the oxide semiconductor film 403. Accordingly, a charge trapping center in the oxide semiconductor film 403 can be decreased. Through the above steps, the oxide semiconductor film 403 can be highly purified to be electrically i-type (intrinsic). Further, impurities in the first to fourth metal oxide films are also removed through this heat treatment; thus, the first to fourth metal oxide films can be highly purified.

Note that in this embodiment, the second heat treatment is performed after formation of the fourth metal oxide film 409; however, there is no particular limitation on the timing of the second heat treatment as long as it is performed after formation of the third metal oxide film 407. For example, the second heat treatment may be performed after formation of the third metal oxide film 407.

By performing the first heat treatment and the second heat treatment as described above, the oxide semiconductor film 403 can be highly purified so as not to contain impurities other than main components as little as possible. The highly-purified oxide semiconductor film 403 contains extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$.

Next, the conductive layer 410 is provided over the fourth metal oxide film 409 and in a region overlapping with a channel formation region of the oxide semiconductor film 403. Thus, the transistor 330 illustrated in FIG. 5E can be completed. The conductive layer 410 can function as a second gate electrode. The conductive layer 410 can be formed using a material and a method which are similar to those of the gate electrode 401. Note that in the case where the conductive layer 410 is used as the second gate electrode, a stacked film of the third metal oxide film 407 and the fourth metal oxide film 409 functions as a second gate insulating film.

The conductive layer 410 is provided to function as the second gate electrode and overlap with the channel formation region of the oxide semiconductor film 403, which enables a reduction of the amount of shift in threshold voltage of the transistor 330 between before and after a bias-temperature stress test (a BT test) by which reliability of the transistor 330 is examined. Note that the potential of the second gate electrode may be the same as or different from that of the gate electrode 401 (first gate electrode). Alternatively, the potential of the second gate electrode may be GND, 0 V, or the second gate electrode may be in a floating state.

Through the above steps, the transistor 330 is completed. The thus obtained transistor 330 includes the oxide semiconductor film 403 which is a highly purified film from which an impurity such as hydrogen, water, a hydroxyl group, or a hydride (also referred to as a hydrogen compound) is intentionally removed. In addition, providing the first to fourth metal oxide films makes it possible to reduce or prevent re-entry of an impurity such as water or hydrogen into the oxide semiconductor film 403 or discharge of oxygen from the oxide semiconductor film 403 and interfaces between the oxide semiconductor film 403 and the insulating films. Therefore, variation in the electrical characteristics of the transistor 330 is suppressed and the transistor 330 is electrically stable.

Although not illustrated, a protective insulating film may be further formed so as to cover the transistor 330. As the protective insulating film, a silicon nitride film, a silicon nitride oxide film, an aluminum nitride film, or the like may be used.

Further, a planarization insulating film may be formed over the transistor 330. The planarization insulating film can be formed using a heat-resistant organic material such as acrylic, polyimide, benzocyclobutene, polyamide, or epoxy. AS an alternative to such organic materials, it is also possible to use a low-dielectric constant material (a low-k material), a siloxane-based resin, PSG (phosphosilicate glass), BPSG (borophosphosilicate glass), or the like. Note that the planarization insulating film may be formed by stacking a plurality of insulating films formed of any of these materials.

<Manufacturing Process of Transistor 320>

An example of a manufacturing process of the transistor 320 illustrated in FIGS. 2A to 2C will be described with reference to FIGS. 6A to 6E. Note that the manufacturing process of the transistor 320 has a lot in common with that of the transistor 330. That is, hereinafter, some description of the same part is omitted.

First, the first metal oxide film 402 is formed over the substrate 400 having an insulating surface. Then, the first metal oxide film 402 is preferably subjected to treatment for supplying oxygen such as oxygen doping treatment.

Note that an insulating film serving as a base film may be provided between the substrate 400 and the first metal oxide film 402. The base film has a function of preventing diffusion of an impurity element from the substrate 400, and can be formed with a single-layer structure or a stacked structure using one or more of a silicon nitride film, a silicon oxide film, a silicon nitride oxide film, and a silicon oxynitride film.

Figure 6A:
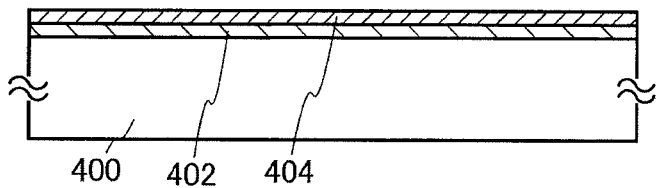
FIGS. 6A to 6E illustrate an example of a manufacturing process of a semiconductor device.

Next, the second metal oxide film 404 is formed over the first metal oxide film 402 (FIG. 6A). After the second metal oxide film 404 is formed, treatment for supplying oxygen such as oxygen doping treatment is preferably performed. Note that the oxygen supply treatment performed on the first metal oxide film 402 may also serve as oxygen supply treatment performed on the second metal oxide film 404.

Figure 6B:
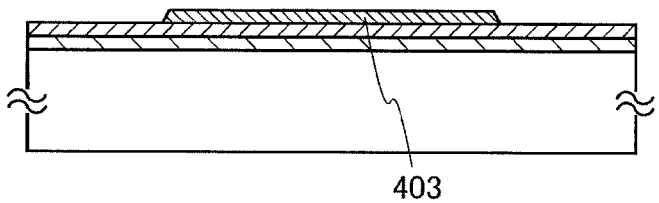

Next, the oxide semiconductor film 403 is formed over the second metal oxide film 404, and then is processed into an island shape (FIG. 6B).

Note that after the oxide semiconductor film 403 is formed, or after the oxide semiconductor film 403 is processed into an island shape, heat treatment (dehydration treatment, dehydrogenation treatment) is preferably performed. The details are similar to those in the transistor 330.

Figure 6C:
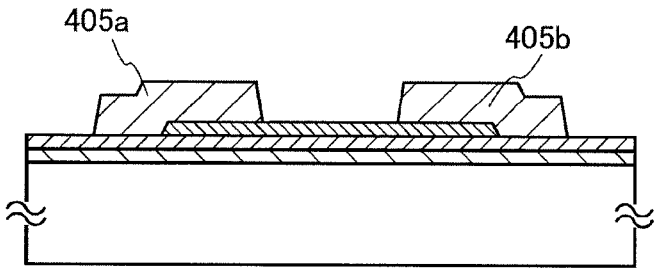

Next, a conductive film to be the source electrode and the drain electrode (including a wiring formed using the same layer as the source electrode and the drain electrode) is formed over the oxide semiconductor film 403. The conductive film is processed, so that the source electrode 405a and the drain electrode 405b are formed (FIG. 6C).

Next, the third metal oxide film 407 is formed so as to cover the source electrode 405a and the drain electrode 405b and be in contact with part of the oxide semiconductor film 403. Next, treatment for supplying oxygen such as oxygen doping treatment is preferably performed on the third metal oxide film 407.

Figure 6D:
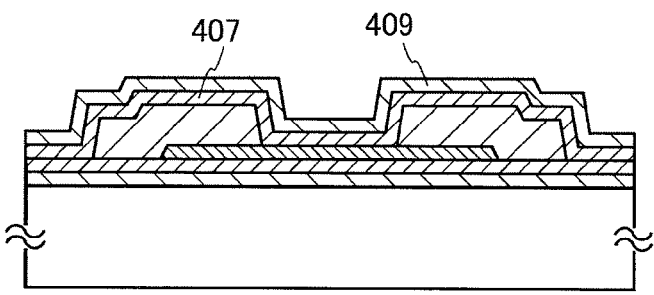

Then, the fourth metal oxide film 409 is formed over the third metal oxide film 407, so that the gate insulating film having a stacked structure of the third metal oxide film 407 and the fourth metal oxide film 409 is formed (FIG. 6D). Note that treatment for supplying oxygen such as oxygen doping treatment is preferably performed after the fourth metal oxide film 409 is formed. Alternatively, the oxygen supply treatment performed on the third metal oxide film 407 may also serve as oxygen supply treatment performed on the fourth metal oxide film 409.

It is preferable that heat treatment be performed after the oxygen supply treatment is performed on the third metal oxide film 407. Through this heat treatment, oxygen can be supplied to the oxide semiconductor film 403 from at least one of the second metal oxide film 404 and the third metal oxide film 407 each containing oxygen.

Next, a conductive film is framed over the fourth metal oxide film 409, and then is processed. In such a manner, the gate electrode 414 is formed. The gate electrode 414 can be formed using a material and a method which are similar to those of the gate electrode 401 in the transistor 330.

Figure 6E:
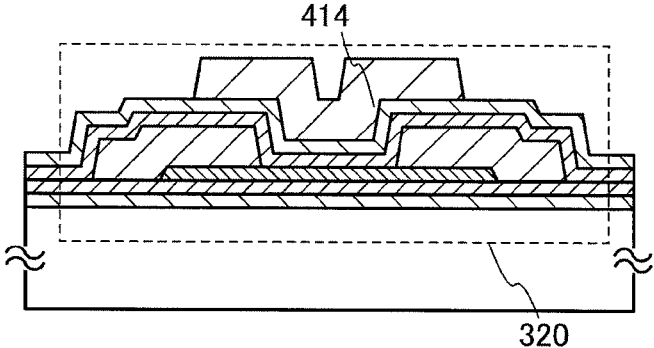

Through the above steps, the transistor 320 can be formed (FIG. 6E).

As described in this embodiment, an insulating film is formed in contact with the oxide semiconductor film with the use of a material containing a Group 13 element and oxygen, whereby the interface between the oxide semiconductor film and the insulating film can be kept in a favorable state.

In particular, when a gallium oxide film or a gallium aluminum oxide film having a large amount of gallium is formed as the insulating film in contact with the oxide semiconductor film, pileup of hydrogen at the interface between the insulating film and the oxide semiconductor film can be effectively suppressed. Further, when the insulating film in contact with the oxide semiconductor film has a stacked structure and an aluminum gallium oxide film having a large amount of aluminum or the like is provided in contact with the gallium oxide film or the gallium aluminum oxide film (i.e., outside the oxide semiconductor film), entry of water into the oxide semiconductor film can be prevented. Furthermore, when films each containing aluminum are provided over and under the oxide semiconductor film and the films each containing aluminum are in close contact with each other, entry of water can be effectively prevented further.

In the case in which the insulating film in contact with the oxide semiconductor film includes a region where the proportion of oxygen is higher than that in the stoichiometric composition, oxygen which might be reduced through dehydration (or dehydrogenation) treatment for the oxide semiconductor film can be supplied to the oxide semiconductor film. Accordingly, oxygen defects in the oxide semiconductor film can be reduced; thus, a charge trapping center in the oxide semiconductor film can be decreased. Through the above steps, the oxide semiconductor film can be highly purified to be electrically i-type (intrinsic).

In the semiconductor device according to one embodiment of the present invention, the highly purified oxide semiconductor film is used as an active layer, whereby the off-state current density of the transistor can be lower than or equal to 10 zA/μm, preferably lower than or equal to 1 zA/μm, more preferably lower than or equal to 1 yA/μm, which depends on the voltage between the source electrode and drain electrode. Accordingly, the transistor including the highly purified oxide semiconductor film as an active layer has much lower off-state current than a transistor including silicon having crystallinity.

Further, with the use of a highly-purified oxide semiconductor, the temperature dependence of the off-state current of the transistor can be significantly decreased. This is because the conductivity type is made to be as close to an intrinsic type as possible by removing impurities which become electron donors (donors) in the oxide semiconductor to highly purify the oxide semiconductor, so that the Fermi level positions in a center of the forbidden band. This also results from the fact that the oxide semiconductor has an energy gap of 3 eV or more and includes very few thermally excited carriers. In addition, the source electrode and the drain electrode are in a degenerated state, which is also a factor of decreasing the temperature dependence. The transistor is mostly operated with carriers injected into the oxide semiconductor from the degenerated source electrode, and the carrier density has no dependence on temperature; therefore, the temperature dependence of the off-state current can be significantly decreased.

In the oxide semiconductor film in which the hydrogen concentration is sufficiently reduced so that the oxide semiconductor film is highly purified and in which defect levels in the energy gap due to oxygen deficiency are reduced by sufficient supply of oxygen, the carrier concentration is sufficiently low. With the use of such an oxide semiconductor film as an active layer, a shift in threshold voltage of the transistor can be suppressed and the transistor can be normally off.

As described above, according to one embodiment of the present invention, a semiconductor device including an oxide semiconductor and having stable electrical characteristics can be provided. Therefore, a semiconductor device with high reliability can be provided.

The structures, methods, and the like described in this embodiment can be combined as appropriate with any of the structures, methods, and the like described in the other embodiments.

[Embodiment 2]

A semiconductor device (also referred to as a display device) with a display function can be manufactured using the transistor an example of which is described in Embodiment 1. Moreover, some or all of the driver circuits which include the transistors can be formed over a substrate where the pixel portion is formed, whereby a system-on-panel can be obtained.

Figure 7A:
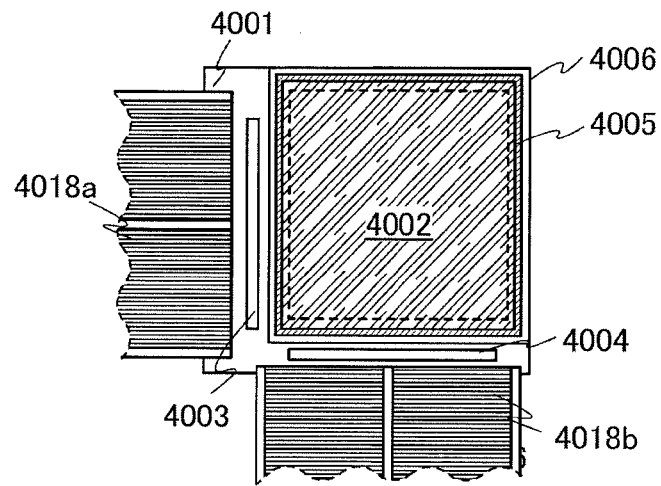
FIGS. 7A to 7C each illustrate one embodiment of a semiconductor device.

In FIG. 7A, a sealant 4005 is provided so as to surround a pixel portion 4002 provided over a first substrate 4001, and the pixel portion 4002 is sealed between the first substrate 4001 and a second substrate 4006. In FIG. 7A, a signal line driver circuit 4003 and a scan line driver circuit 4004 which are formed using a single crystal semiconductor film or a polycrystalline semiconductor film over a substrate separately prepared are mounted over the first substrate 4001, in a region that is different from the region surrounded by the sealant 4005. Various signals and potential are supplied to the signal line driver circuit 4003 and the scan line driver circuit 4004 which are separately formed and to the pixel portion 4002 from flexible printed circuits (FPCs) 4018a and 4018b.

Figure 7B:
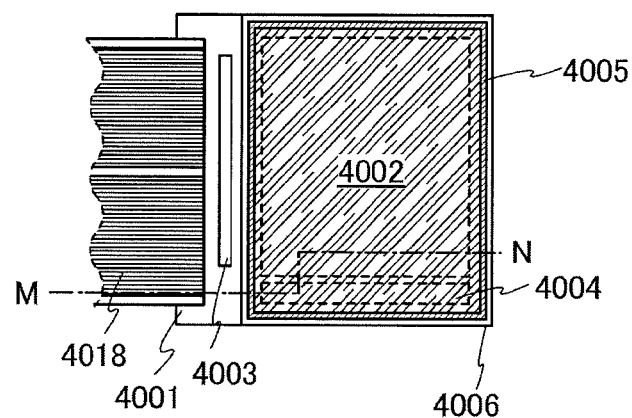
Figure 7C:
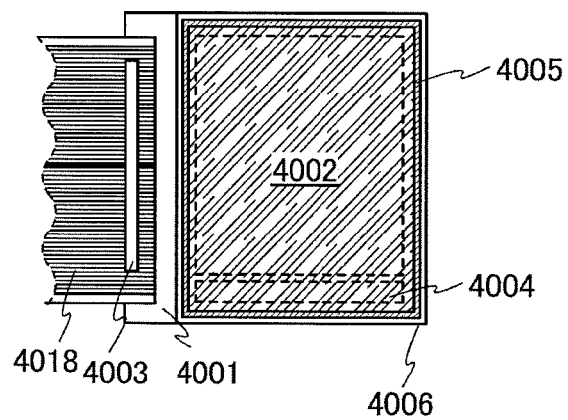

In FIGS. 7B and 7C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 7B and 7C, the signal line driver circuit 4003 which is formed using a single crystal semiconductor film or a polycrystalline semiconductor film over a substrate separately prepared is mounted over the first substrate 4001, in a region that is different from the region surrounded by the sealant 4005. In FIGS. 7B and 7C, various signals and potential are supplied to the signal line driver circuit 4003 which is separately formed, the scan line driver circuit 4004, and the pixel portion 4002 from an FPC 4018.

Although FIGS. 7B and 7C each illustrate an example in which the signal line driver circuit 4003 is formed separately and mounted on the first substrate 4001, the display device according to the present invention is not limited to this structure. The scan line driver circuit may be separately formed and then mounted, or only part of the signal line driver circuit or only part of the scan line driver circuit may be separately formed and then mounted.

Note that there is no particular limitation on a connection method of a separately formed driver circuit, and a chip on glass (COG) method, a wire bonding method, a tape automated bonding (TAB) method or the like can be used. FIG. 7A illustrates an example in which the signal line driver circuit 4003 and the scan line driver circuit 4004 are mounted by a COG method. FIG. 7B illustrates an example in which the signal line driver circuit 4003 is mounted by a COG method. FIG. 7C illustrates an example in which the signal line driver circuit 4003 is mounted by a TAB method.

In addition, the display device includes a panel in which the display element is sealed, and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors and the transistor which is described in Embodiment 1 can be used therefor.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 8:
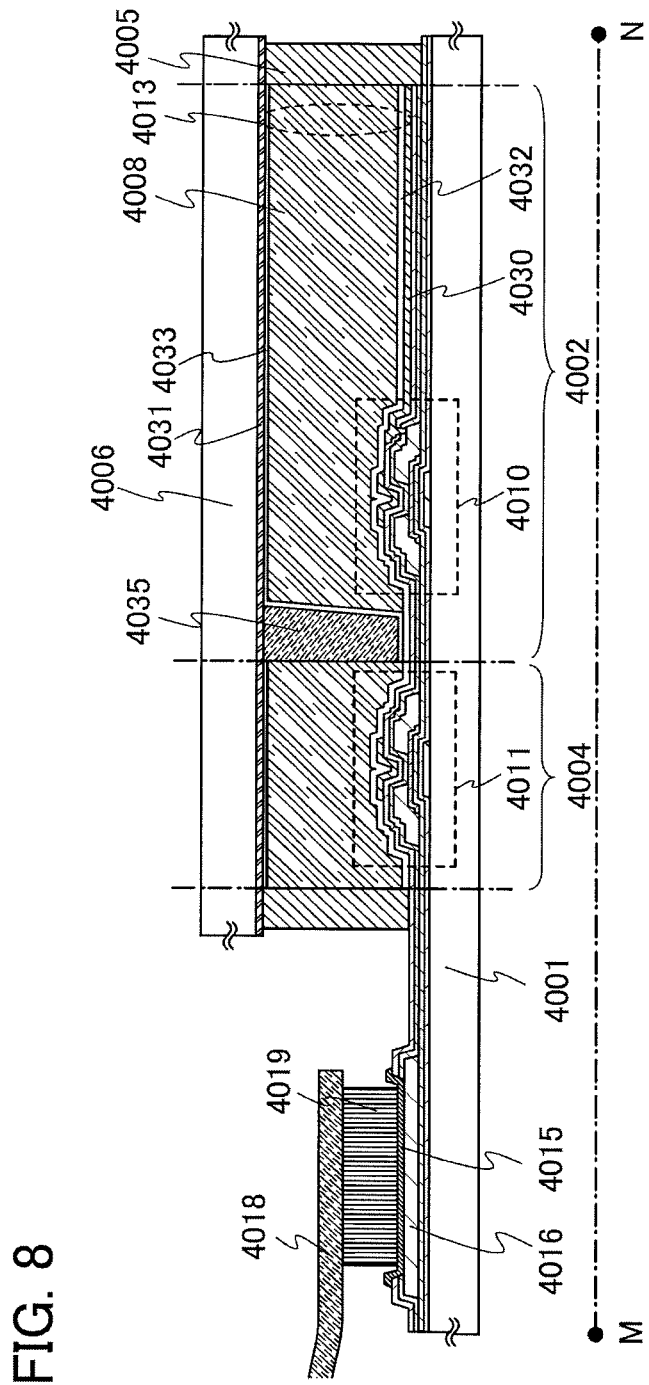
FIG. 8 illustrates one embodiment of a semiconductor device.
Figure 9:
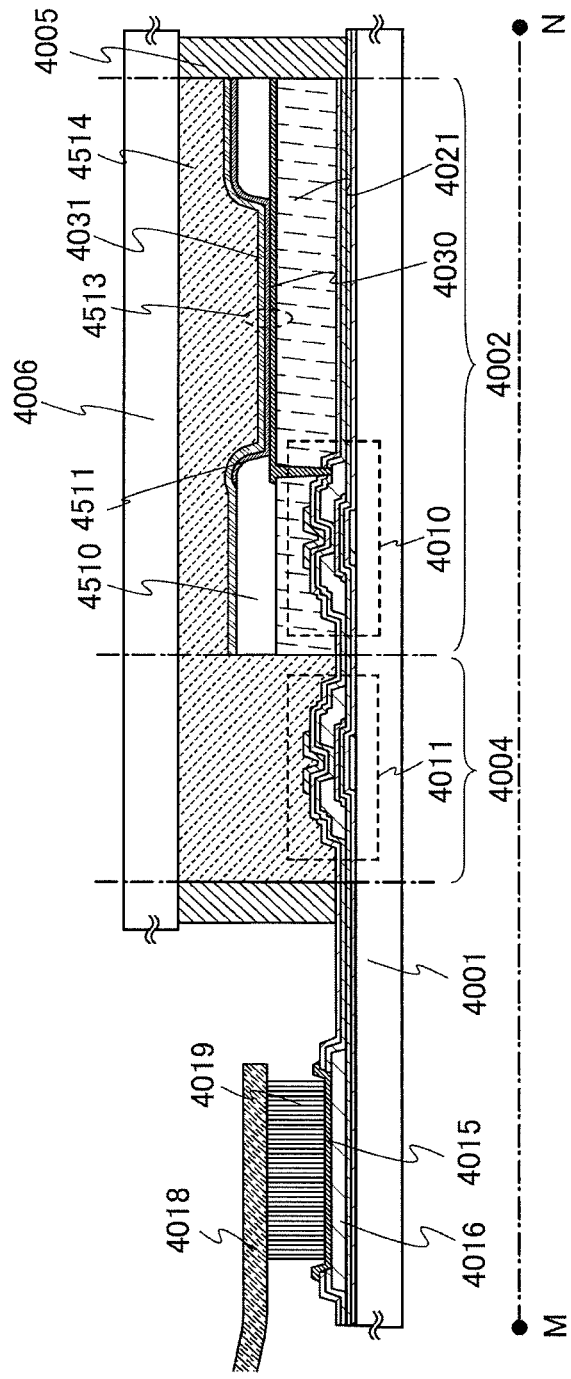
FIG. 9 illustrates one embodiment of a semiconductor device.
Figure 10:
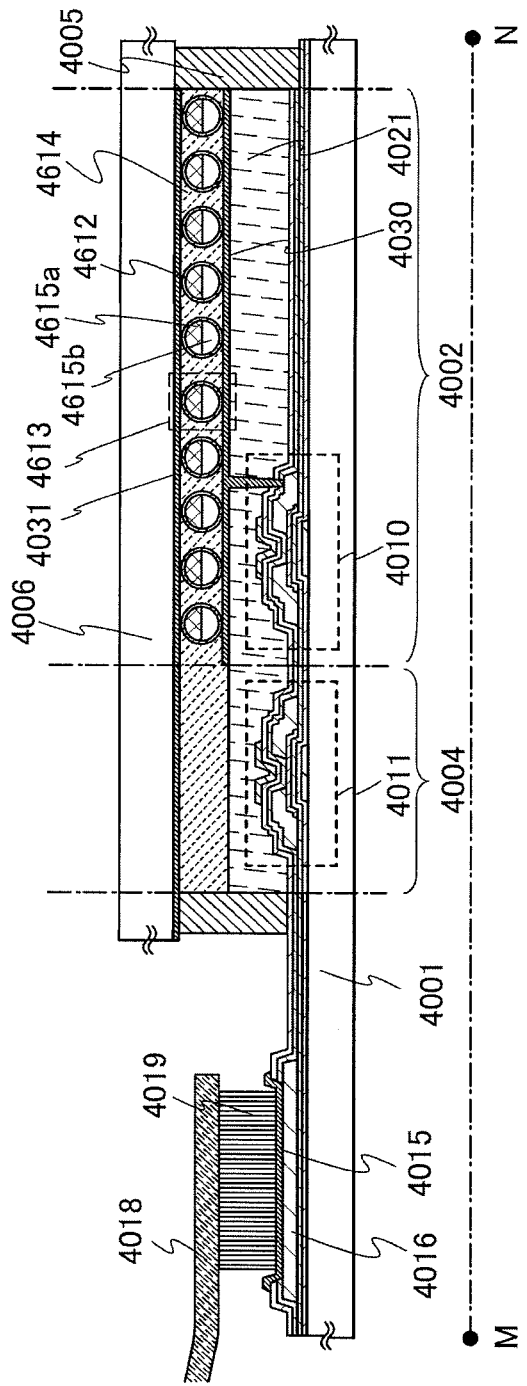
FIG. 10 illustrates one embodiment of a semiconductor device.

One embodiment of the semiconductor device is described with reference to FIG. 8, FIG. 9, and FIG. 10. FIG. 8, FIG. 9, and FIG. 10 correspond to cross-sectional views taken along line M-N in FIG. 7B.

As illustrated in FIG. 8, FIG. 9, and FIG. 10, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed from the same conductive film as a first electrode layer (a first electrode) 4030. The terminal electrode 4016 is formed from the same conductive film as a source electrode and a drain electrode of transistors 4010 and 4011.

Each of the pixel portion 4002 and the scan line driver circuit 4004 which are provided over the first substrate 4001 includes a plurality of transistors. In FIG. 8, FIG. 9, and FIG. 10, the transistor 4010 included in the pixel portion 4002 and the transistor 4011 included in the scan line driver circuit 4004 are illustrated as an example.

In this embodiment, any of the transistors described in Embodiment 1 can be applied to the transistors 4010 and 4011. Note that an example in which the transistor 330 described in Embodiment 1 is used is shown in FIG. 8, FIG. 9, and FIG. 10; however, this embodiment is not limited to this example. The transistor 310, 320, 340, 350, 360, 370, 380, or 390 may be used instead of the transistor 330 as appropriate. In addition, the transistors 4010 and 4011 do not necessarily need to have the same structure. Variation in the electric characteristics of the transistors 4010 and 4011 is suppressed and the transistors 4010 and 4011 are electrically stable. Thus, as the semiconductor devices of this embodiment illustrated in FIG. 8, FIG. 9, and FIG. 10, a semiconductor device with high reliability can be obtained.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is shown in FIG. 8. In FIG. 8, a liquid crystal element 4013 which is a display element includes the first electrode layer 4030, a second electrode layer (a second electrode) 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness of the liquid crystal layer 4008 (a cell gap). Alternatively, a spherical spacer may also be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes liquid crystal exhibiting a blue phase and a chiral agent has a short response time of 1 msec or less, has optical isotropy, which makes the alignment process unneeded, and has a small viewing angle dependence. In addition, since an alignment film does not need to be provided and thus rubbing treatment is unnecessary, electrostatic discharge damage caused by the rubbing treatment can be prevented and defects and damage of the liquid crystal display device in the manufacturing process can be reduced. Thus, productivity of the liquid crystal display device can be increased.

The specific resistivity of the liquid crystal material is $1 \times 10^9$ $\Omega \cdot cm$ or more, preferably $1 \times 10^{11}$ $\Omega \cdot cm$ or more, further preferably $1 \times 10^{12}$ $\Omega \cdot cm$ or more. The value of the specific resistivity in this specification is measured at 20° C.

The size of a storage capacitor formed in the liquid crystal display device is set in consideration of the leakage current of the transistor provided in the pixel portion or the like so that charge can be held for a predetermined period. By using the transistor including the high-purity oxide semiconductor film, it is enough to provide a storage capacitor having capacitance that is ⅓ or less, preferably ⅕ or less of liquid crystal capacitance of each pixel.

In the transistor including the highly-purified oxide semiconductor film of this embodiment, the current in an off state (the off-state current) can be made low. Accordingly, an electrical signal such as an image signal can be held for a longer period in the pixel, and an interval between writing operations can be set longer in an on state. Accordingly, frequency of refresh operation can be reduced, which leads to an effect of suppressing power consumption.

In addition, the transistor including the highly-purified oxide semiconductor film of this embodiment can have relatively high field-effect mobility and thus can operate at high speed. Therefore, by using the transistor in a pixel portion of a liquid crystal display device, a high-quality image can be provided. In addition, since the above transistor can be provided in each of a driver circuit portion and a pixel portion provided over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as a vertical alignment mode. For example, a multi-domain vertical alignment (MVA) mode, a patterned vertical alignment (PVA) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel for color display are not limited to three colors: R, and B (R, G, and B correspond to red, green, and blue, respectively). For example, R, G; B, and W (W corresponds to white); R, G; B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Figure 12A:
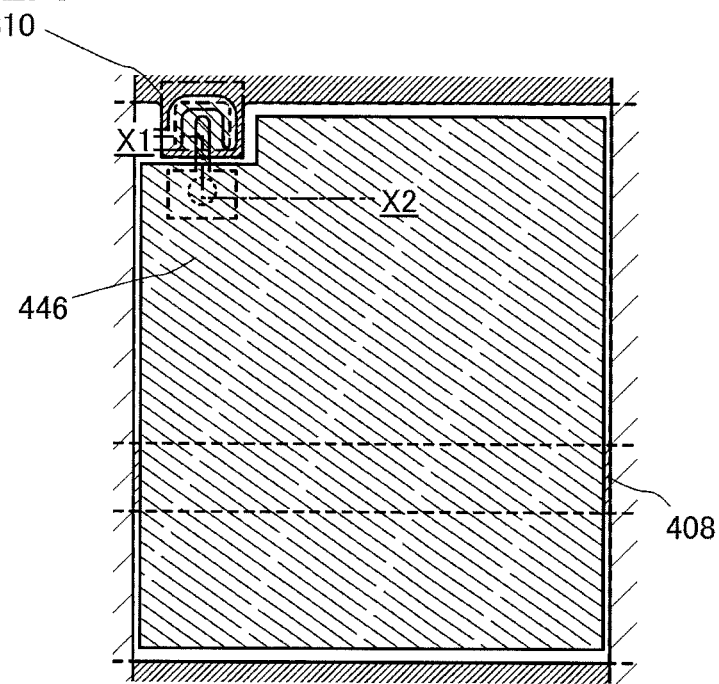
FIGS. 12A and 12B are a plan view and a cross-sectional view illustrating one embodiment of a semiconductor device.
Figure 12B:
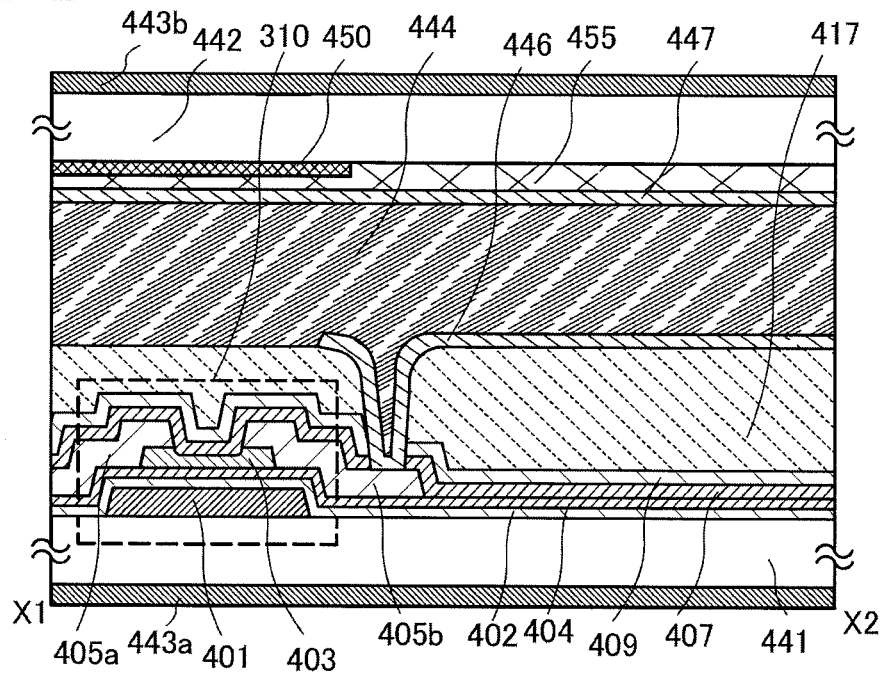

FIG. 12A is a plan view of one pixel in a liquid crystal display device to which the transistor 310 described in Embodiment 1 is applied. FIG. 12B is a cross-sectional view taken along line X1-X2 in FIG. 12A.

In FIG. 12A, a plurality of source wirings (including the source electrode 405*a*) is arranged in parallel (extend in the vertical direction in the drawing) to be spaced from each other. A plurality of gate wirings (including the gate electrode 401) is provided to extend in a direction generally perpendicular to the source wirings (the horizontal direction in the drawing) and to be spaced from each other. Capacitor wirings 408 are adjacent to the plurality of gate wirings and extend in a direction generally parallel to the gate wirings, that is, in a direction generally perpendicular to the source wirings (in the horizontal direction in the drawing). A space with a generally rectangular shape, which is surrounded by the source wirings, the capacitor wirings 408, and the gate wirings, is provided with a pixel electrode and a common electrode of the liquid crystal display device with a liquid crystal layer 444 interposed therebetween. The transistor 310 for driving the pixel electrode is provided at an upper left corner of the drawing. A plurality of pixel electrodes and a plurality of transistors are arranged in matrix.

In the liquid crystal display device in FIGS. 12A and 12B, a first electrode 446 which is electrically connected to the transistor 310 functions as the pixel electrode, and a second electrode 447 functions as the common electrode. An alignment film may be provided between the first electrode 446 and the liquid crystal layer 444 or between the second electrode 447 and the liquid crystal layer 444. In the pixel illustrated in FIGS. 12A and 12B, a light-blocking layer 450 (a black matrix) is provided on a second substrate 442 side which is a counter substrate side in a region where the first electrode 446 and the second electrode 447 do not overlap with each other. The second substrate 442 is provided with an insulating layer 455 on the light-blocking layer 450.

Note that the light-blocking layer 450 can be provided either on the inner side of a pair of substrates bonded to each other with the liquid crystal layer 444 interposed therebetween (on the liquid crystal layer 444 side), or on the outer side of the substrates (on the side opposite to the liquid crystal layer 444).

The transistor 310 includes the gate electrode 401, the gate insulating film having a stacked structure of the first metal oxide film 402 and the second metal oxide film 404, the oxide semiconductor film 403, the source electrode 405*a*, the drain electrode 405*b*, the third metal oxide film 407, and the fourth metal oxide film 409. In addition, an interlayer film 417 is formed over the transistor 310.

Although not illustrated, a backlight, a sidelight, or the like can be used as a light source. Light from the light source is emitted from the side of a first substrate 441, which is an element substrate, so as to pass through the second substrate 442 on the viewing side.

In FIGS. 12A and 12B, a polarizing plate 443*a* is provided on the outer side (on the side opposite to the liquid crystal layer 444) of the first substrate 441, and a polarizing plate 443*b* is provided on the outer side (on the side opposite to the liquid crystal layer 444) of the second substrate 442.

In the structure illustrated in FIGS. 12A and 12B, the gate electrode 401 is provided so as to overlap with the lower side of the oxide semiconductor film 403, and the light-blocking layer 450 is provided so as to cover the upper side of the oxide semiconductor film 403. Consequently, light enters the transistor 310 from neither the upper side nor the lower side. Since light does not enter the transistor, characteristics of the transistor can be prevented from being degraded.

Figure 13A:
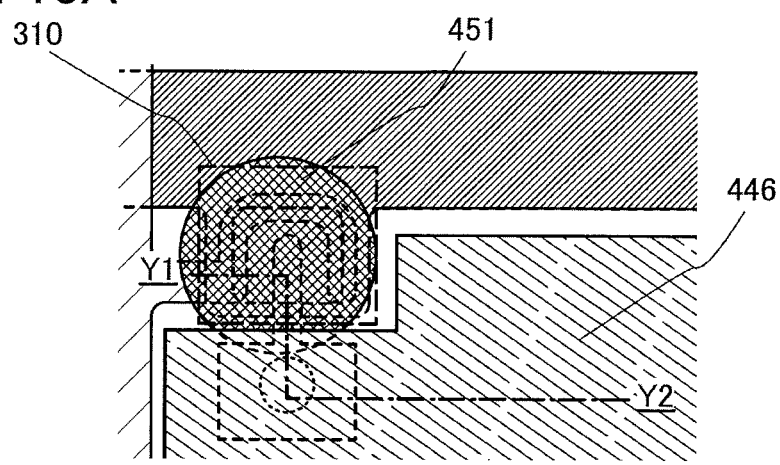
FIGS. 13A and 13B are a plan view and a cross-sectional view illustrating one embodiment of a semiconductor device.
Figure 13B:
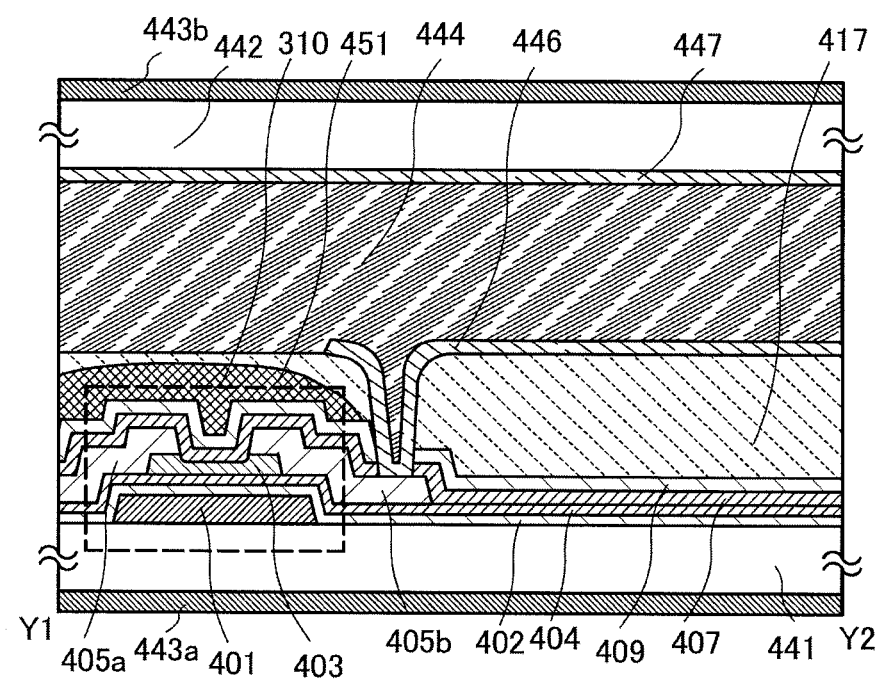

FIG. 13A is a plan view of part of one pixel in another liquid crystal display device to which the transistor 310 described in Embodiment 1 is applied. FIG. 13B is a cross-sectional view taken along line Y1-Y2 in FIG. 13A.

In the liquid crystal display device illustrated in FIGS. 13A and 13B, a plurality of pixels is arranged in matrix, and the transistor 310 which includes the oxide semiconductor film and is described in Embodiment 1 is formed in the pixel. In addition, the liquid crystal display device includes a light-blocking layer 451, the interlayer film 417 provided as the planarization film, the first electrode 446 used as the pixel electrode, and the liquid crystal layer 444 over the pixel electrode layer. Note that an example in which the bottom-gate transistor 310 described in Embodiment 1 is applied is illustrated in FIGS. 13A and 13B; however, this embodiment is not limited to this example.

In FIGS. 13A and 13B, the light-blocking layer 451 (black matrix) is provided in a region overlapping with at least the oxide semiconductor film 403 so as to cover the transistor 310. The light-blocking layer 451 can block light incident on the oxide semiconductor film 403 of the transistor 310; accordingly, electrical characteristics of the transistor 310 can be prevented from begin varied due to photosensitivity of the oxide semiconductor film 403, and can be stabilized. Further, the light-blocking layer 451 can prevent light leakage to an adjacent pixel, which allows higher contrast and higher definition display. Therefore, high definition and high reliability of the liquid crystal display device can be achieved.

The light-blocking layer may be further formed on the counter substrate side of the liquid crystal display device because further improvement in contrast and stabilization of the transistor can be achieved. When the light-blocking layer is formed on the counter substrate side, the light-blocking layer is formed in a region corresponding to the transistor (at least in a region overlapping with the semiconductor layer of the transistor) with the liquid crystal layer interposed therebetween, so that electrical characteristics of the transistor can be further prevented from being varied due to light incident from the counter substrate.

The light-blocking layer 451 is formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, aluminum, or the like, for example.

There is no particular limitation on the method for forming the light-blocking layer 451, and a dry method such as an evaporation method, a sputtering method, or a CVD method or a wet method such as spin coating, dip coating, spray coating, or a droplet discharging method (such as an inkjet method, screen printing, or offset printing) may be used depending on the material. As needed, an etching method (dry etching or wet etching) may be employed to form a desired pattern.

Note that as illustrated in FIGS. 13A and 13B, in the case where the light-blocking layer is formed as part of the interlayer film 417, the problem of misalignment between the light-blocking layer and a pixel region does not occur, whereby the formation region can be controlled more precisely even when a pixel has a minute pattern. When the light-blocking layer 451 is provided on the first substrate 441 side, light emitted from the counter substrate side is neither absorbed nor blocked by the light-blocking layer 451 in light irradiation performed on the liquid crystal layer 444 for polymer stabilization; thus, the entire liquid crystal layer 444 can be uniformly irradiated with light. Thus, alignment disorder of liquid crystal due to nonuniform photopolymerization, display unevenness due to the alignment disorder, and the like can be prevented.

Figure 14A:
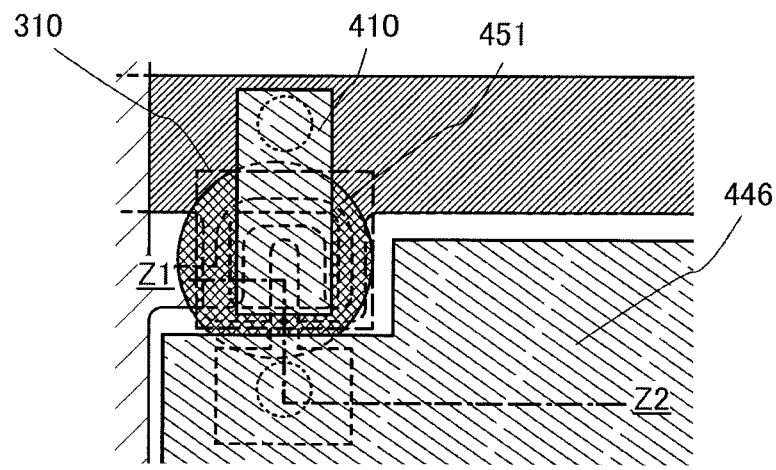
FIGS. 14A and 14B are a plan view and a cross-sectional view illustrating one embodiment of a semiconductor device.
Figure 14B:
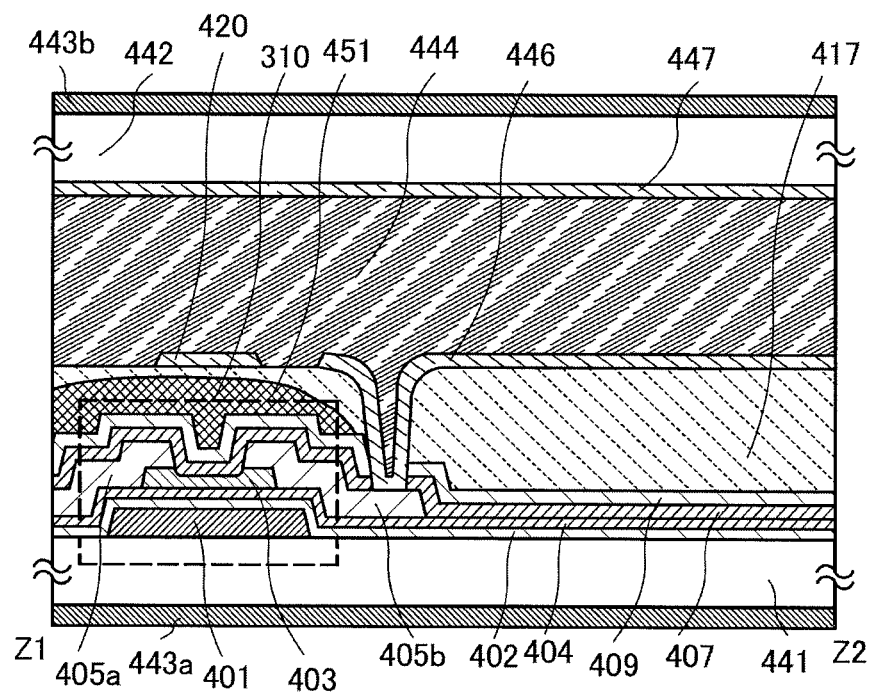

As illustrated in FIGS. 14A and 14B, over the light-blocking layer 451 and the interlayer film 417, a conductive layer 420 formed from the same layer as the first electrode 446 may be provided in a region overlapping with a channel formation region of the oxide semiconductor film 403. The conductive layer 420 can function a second gate electrode. Note that FIG. 14B is a cross-sectional view taken along line Z1-Z2 in FIG. 14A.

In the structure illustrated in FIGS. 13A and 13B and FIGS. 14A and 14B, the gate electrode 401 is provided so as to overlap with the lower side of the oxide semiconductor film 403, and the light-blocking layer 451 is provided so as to cover the upper side of the oxide semiconductor film 403. Consequently, light enters the transistor from neither the upper side nor the lower side. Thus, irradiation with stray light on the oxide semiconductor film 403 can be reduced to about one-tenth, preferably one-hundredth of that in the case where the light-blocking layer is not provided. With such light blocking, deterioration of the transistor can be reduced.

In the structure illustrated in FIGS. 14A and 14B, the conductive layer 420 is provided to overlap with the channel formation region of the oxide semiconductor film 403, which enables a reduction of the amount of shift in threshold voltage of the transistor between before and after a BT test by which reliability of the transistor is examined.

Figure 15A:
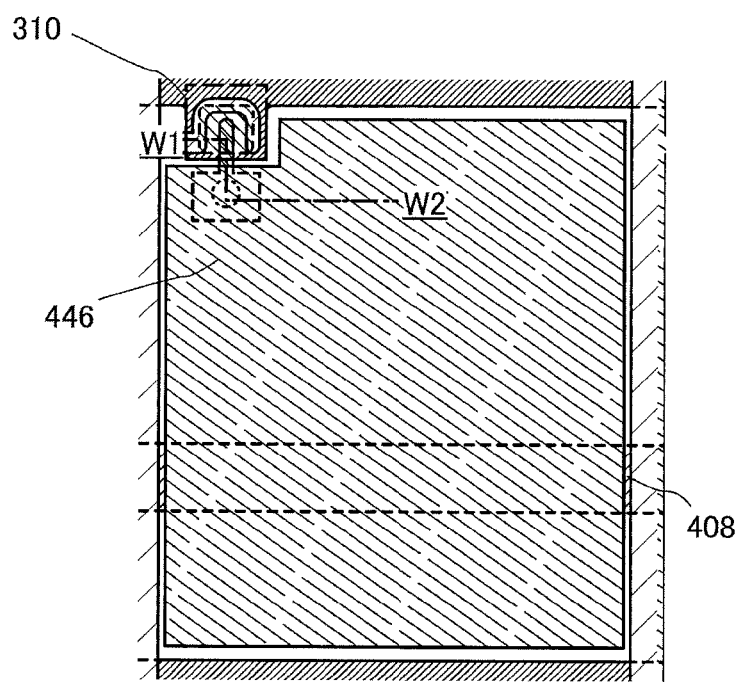
FIGS. 15A and 15B are a plan view and a cross-sectional view illustrating one embodiment of a semiconductor device.
Figure 15B:
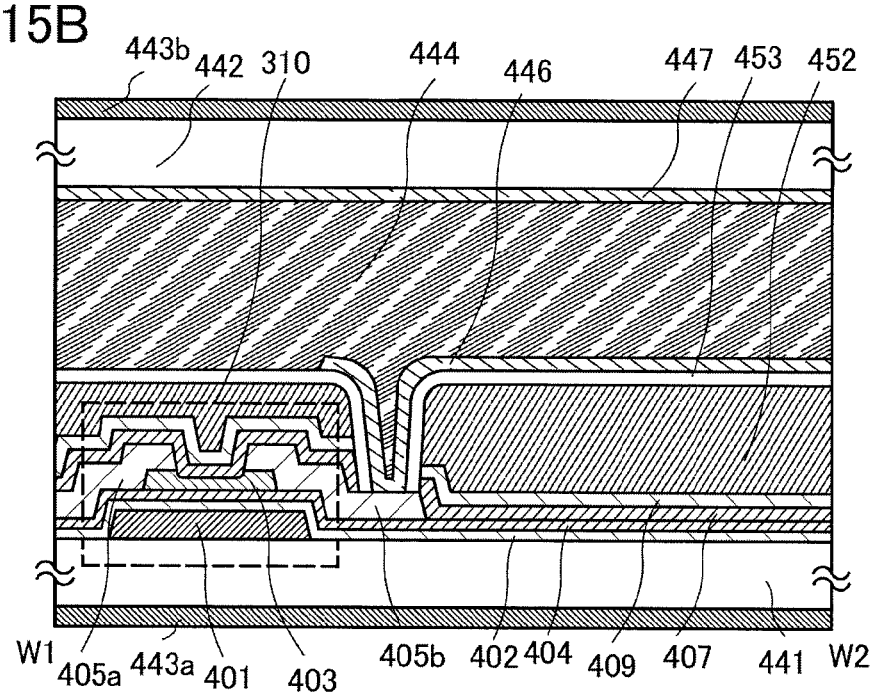

The interlayer film can be formed using a light-transmitting chromatic color resin layer. FIGS. 15A and 15B illustrate a liquid crystal display device in which the transistor 310 described in Embodiment 1 is applied and a light-transmitting chromatic color resin layer is used for an interlayer film. Note that FIG. 15B is a cross-sectional view taken along line W1-W2 in FIG. 15A.

In the liquid crystal display device in FIGS. 15A and 15B, a plurality of pixels is arranged in matrix, and the transistor 310 including the oxide semiconductor film is formed in the pixel. In addition, the liquid crystal display device includes an interlayer film 452 over the transistor, an insulating layer 453 over the interlayer film 452, the first electrode 446 functioning as a pixel electrode over the insulating layer 453, and the liquid crystal layer 444 over the pixel electrode. The interlayer film 452 is a light-transmitting chromatic color resin layer.

The transistor 310 includes the gate electrode 401, the gate insulating film including the first metal oxide film 402 and the second metal oxide film 404, the oxide semiconductor film 403, the source electrode 405a, the drain electrode 405b, the third metal oxide film 407, and the fourth metal oxide film 409

For the interlayer film 452 of the liquid crystal display device of FIGS. 15A and 15B, a light-transmitting chromatic color resin layer is used as a film having a function of attenuating the intensity of transmitting visible light. The transmittance of visible light of the light-transmitting chromatic color resin layer is lower than that of the oxide semiconductor film 403.

When a coloring layer of the light-transmitting chromatic color resin layer is used as the interlayer film 452 provided over the transistor 310, the intensity of incident light on the oxide semiconductor film 403 of the transistor 310 can be attenuated without a reduction in aperture ratio of the pixel. Accordingly, electrical characteristics of the transistor 310 can be prevented from being varied due to photosensitivity of the oxide semiconductor, and can be stabilized. Further, the light-transmitting chromatic color resin layer can function as a color filter layer. In the case of providing a color filter layer on the counter substrate side, precise positional alignment of a pixel region with an element substrate over which a transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Chromatic colors are colors except achromatic colors such as black, gray, and white. The coloring layer is formed using a material which transmits only chromatic color light in order to function as the color filter. As the chromatic color, red, green, blue, or the like can be used. Alternatively, cyan, magenta, yellow, or the like may also be used. "Transmitting only the chromatic color light" means that light transmitted through the coloring layer has a peak at the wavelength of the chromatic color light.

The thickness of the light-transmitting chromatic color resin layer is preferably controlled as appropriate and optimized in consideration of the relation between the concentration of the coloring material to be included and the transmittance, in order that the light-transmitting chromatic color resin layer functions as a coloring layer (a color filter). In the case where the interlayer film 452 is stacked with a plurality of thin films, if at least one layer thereof is a light-transmitting chromatic color resin layer, the interlayer film 452 can function as a color filter.

In the case where the thickness of the light-transmitting chromatic color resin layer varies depending on the chromatic colors or in the case where there is surface unevenness due to a light-blocking layer or a transistor, an insulating layer which transmits light in a visible wavelength range (a so-called colorless, transparent insulating layer) may be stacked for planarization of the surface of the interlayer film. Improvement in planarization of the interlayer film allows favorable coverage with a pixel electrode or a common electrode to be formed thereover and uniform gap (thickness) of a liquid crystal layer, whereby the visibility of the liquid crystal display device is increased and higher image quality can be achieved.

Although not illustrated in FIGS. 12A and 12B, FIGS. 13A and 13B, FIGS. 14A and 14B, and FIGS. 15A and 15B, an alignment film or an optical film such as a retardation plate or an anti-reflection film is provided as appropriate. For example, circular polarization may be employed using a polarizing plate or a retardation plate.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film-type inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film-type inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

FIG. 9 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, water, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filling material 4514 is provided for sealing. It is preferable that the light-emitting element be packaged (sealed) with a protective film (such as a laminate film or an ultraviolet curable resin film) or a cover material with high air-tightness and little degasification so that the light-emitting element is not exposed to the outside air, in this manner.

As the filling material 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used for the filling material.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

Liquid in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 10 illustrates an active matrix electronic paper as one embodiment of a semiconductor device. The electronic paper in FIG. 10 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filling material 4614 such as a resin. The second electrode layer 4031 corresponds to a common electrode (counter electrode). The second electrode layer 4031 is electrically connected to a common potential line.

In FIG. 8, FIG. 9, and FIG. 10, as the first substrate 4001 and the second substrate 4006, flexible substrates, for example, light-transmitting plastic substrates or the like can be used, as well as glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarization insulating film. In addition to such organic insulating materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed using these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), a roll coating method, a curtain coating method, a knife coating method, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, depending on the direction in which light is extracted, the position where the electrode layer is provided, the pattern structure of the electrode layer, and the like.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, can be used.

The first electrode layer 4030 and the second electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of any of these metals; and a nitride of any of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1, a semiconductor device having high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

This embodiment can be implemented in appropriate combination with the structures described in the other embodiments.

[Embodiment 3]

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 11A:
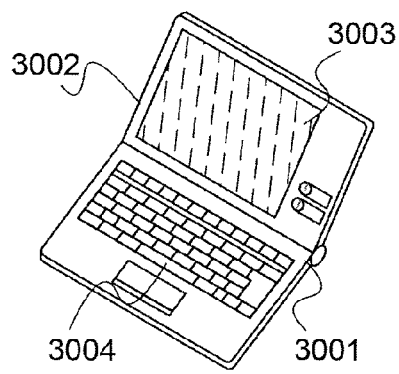
FIGS. 11A to 11F each illustrate an electronic device.

FIG. 11A illustrates a laptop personal computer, which includes a main body 3001, a housing 3002, a display portion 3003, a keyboard 3004, and the like. By applying the semiconductor device described in Embodiment 1 or 2, the laptop personal computer can have high reliability.

Figure 11B:
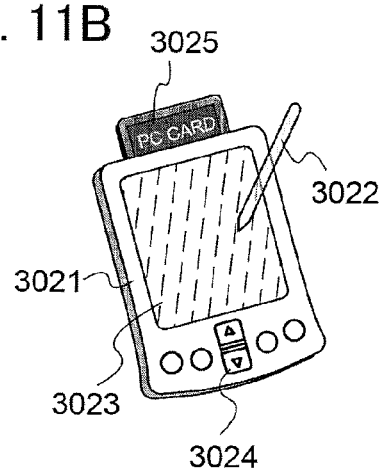

FIG. 11B illustrates a portable information terminal (PDA), which includes a display portion 3023, an external interface 3025, an operation button 3024, and the like in a main body 3021. A stylus 3022 is provided as an accessory for operation. By applying the semiconductor device described in Embodiment 1 or 2, the portable information terminal (PDA) can have higher reliability.

Figure 11C:
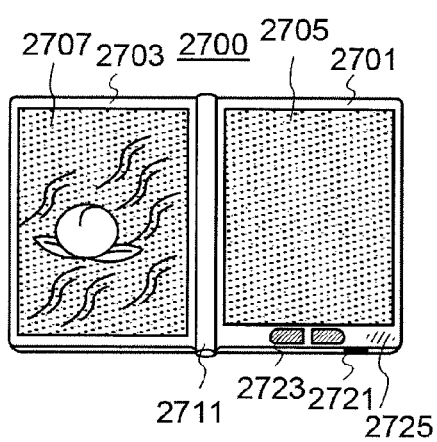

FIG. 11C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 11C) can display text and a display portion on the left side (the display portion 2707 in FIG. 11C) can display graphics. By applying the semiconductor device described in Embodiment 1 or 2, the electronic book reader 2700 can have high reliability.

Further, FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 11D:
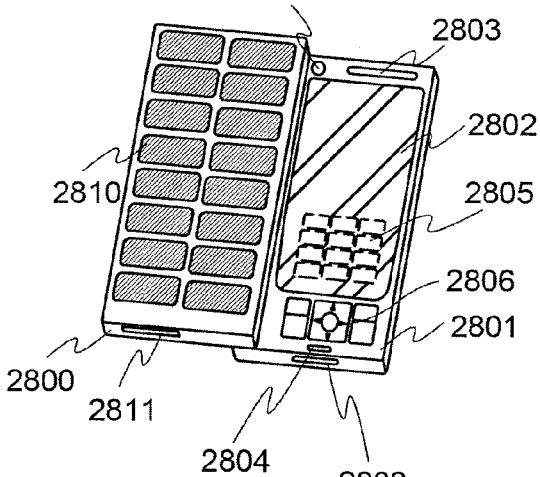

FIG. 11D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. By applying the semiconductor device described in Embodiment 1 or 2, the mobile phone can have high reliability.

Further, the display panel 2802 is provided with a touch panel. A plurality of operation keys 2805 that are displayed as images are shown by dashed lines in FIG. 11D. Note that a boosting circuit by which a voltage output from the solar cell 2810 is increased to be sufficiently high for each circuit is also included.

In the display panel 2802, the display direction can be appropriately changed depending on a usage pattern. Further, the camera lens 2807 is provided on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be transferred.

Further, in addition to the above functions, an infrared communication function, a television reception function, or the like may be provided.

Figure 11E:
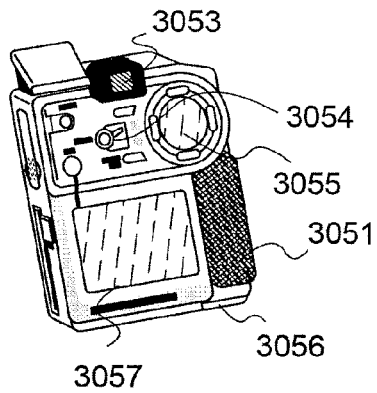

FIG. 11E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 11F:
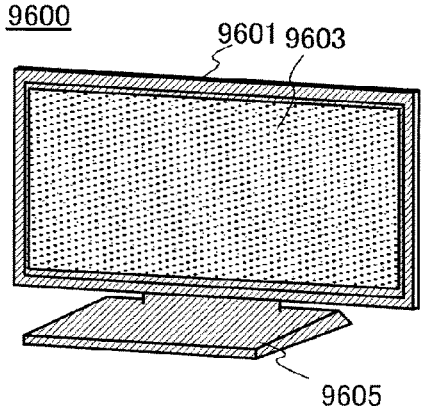

FIG. 11F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

EXPLANATION OF REFERENCE

310: transistor, 320: transistor, 330: transistor, 340: transistor, 350: transistor, 360: transistor, 370: transistor, 380: transistor, 390: transistor, 400: substrate, 401: gate electrode, 402: first metal oxide film, 403: oxide semiconductor film, 404: second metal oxide film, 405*a*: source electrode, 405*b*: drain electrode, 407: third metal oxide film, 408: capacitor wiring, 409: fourth metal oxide film, 410: conductive layer, 411: metal oxide film, 413: metal oxide film, 414: gate electrode, 417: interlayer film, 420: conductive layer, 441: substrate, 442: substrate, 443*a*: polarizing plate, 443*b*: polarizing plate, 444: liquid crystal layer, 446: electrode, 447: electrode, 450: light-blocking layer, 451: light-blocking layer, 452: interlayer film, 453: insulating layer, 455: insulating layer, 2700: electronic book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion B, 3056: battery, 3057: display portion A, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4021: insulating layer, 4030: electrode layer, 4031: electrode layer, 4032: insulating film, 4510: partition wall, 4511: electroluminescent layer, 4513: light-emitting element, 4514: filling material, 4612: cavity, 4613: spherical particle, 4614: filling material, 4615*a*: black region, 4615*b*: white region, 9600: television set, 9601: housing, 9603: display portion, and 9605: stand This application is based on Japanese Patent Application serial no. 2010-152342 filed with Japan Patent Office on Jul. 2, 2010, the entire contents of which are hereby incorporated by reference.

The invention claimed is:

1. A semiconductor device comprising:
a gate electrode;
a gate insulating film covering the gate electrode and having a stacked structure including a first metal oxide film and a second metal oxide film;
an oxide semiconductor film in contact with the second metal oxide film and in a region overlapping with the gate electrode;
a source electrode and a drain electrode electrically connected to the oxide semiconductor film;
a third metal oxide film over and in contact with the oxide semiconductor film; and
a fourth metal oxide film over and in contact with the third metal oxide film,
wherein the first metal oxide film, the second metal oxide film, the third metal oxide film, and the fourth metal oxide film each contain a Group 13 element and oxygen,
wherein each of the source electrode and the drain electrode is surrounded by the second metal oxide film and the third metal oxide film in a cross-sectional view, such that the third metal oxide film contacts top and peripheral side surfaces of at least one of the source electrode and the drain electrode, and the second metal oxide film and the oxide semiconductor film contact a bottom surface of the at least one of the source electrode and the drain electrode.

2. The semiconductor device according to claim 1, further comprising a conductive layer over the fourth metal oxide film and in a region overlapping with the oxide semiconductor film.

3. The semiconductor device according to claim 1, wherein the second metal oxide film and the third metal oxide film are at least partly in contact with each other.

4. The semiconductor device according to claim 1, wherein the first metal oxide film, the second metal oxide film, the third metal oxide film, and the fourth metal oxide film each include a region where a proportion of oxygen is higher than a proportion of oxygen in stoichiometric composition.

5. The semiconductor device according to claim 1, wherein the first metal oxide film and the fourth metal oxide film each contain one of aluminum oxide and aluminum gallium oxide.

6. The semiconductor device according to claim 1, wherein the second metal oxide film and the third metal oxide film each contain one of gallium oxide and gallium aluminum oxide.

7. The semiconductor device according to claim 1, wherein the oxide semiconductor film contains indium, gallium, and oxygen.

8. The semiconductor device according to claim 1, wherein the oxide semiconductor film is surrounded by the second metal oxide film and the third metal oxide film.

9. The semiconductor device according to claim 1, wherein, in the cross-sectional view, the third metal oxide film contacts an entirety of the top and peripheral side surfaces of at least one of the source electrode and the drain electrode, and the second metal oxide film and the oxide semiconductor film contacts an entirety of the bottom surface of at least one of the source electrode and the drain electrode.

10. A semiconductor device comprising:
a first metal oxide film;
a second metal oxide film over and in contact with the first metal oxide film;
an oxide semiconductor film over and in contact with the second metal oxide film;
a source electrode and a drain electrode electrically connected to the oxide semiconductor film;
a gate insulating film having a stacked structure including a third metal oxide film in contact with the oxide semiconductor film and a fourth metal oxide film in contact with the third metal oxide film; and
a gate electrode over the gate insulating film and in a region overlapping with the oxide semiconductor film, wherein the first metal oxide film, the second metal oxide film, the third metal oxide film, and the fourth metal oxide film each contain a Group 13 element and oxygen,
wherein each of the source electrode and the drain electrode is surrounded by the second metal oxide film and the third metal oxide film in a cross-sectional view, such that the third metal oxide film contacts top and peripheral side surfaces of at least one of the source electrode and the drain electrode, and the second metal oxide film and the oxide semiconductor film contact a bottom surface of the at least one of the source electrode and the drain electrode.

11. The semiconductor device according to claim 10, further comprising a conductive layer over the fourth metal oxide film and in a region overlapping with the oxide semiconductor film.

12. The semiconductor device according to claim 10, wherein the second metal oxide film and the third metal oxide film are at least partly in contact with each other.

13. The semiconductor device according to claim 10, wherein the first metal oxide film, the second metal oxide film, the third metal oxide film, and the fourth metal oxide film each include a region where a proportion of oxygen is higher than a proportion of oxygen in stoichiometric composition.

14. The semiconductor device according to claim 10, wherein the first metal oxide film and the fourth metal oxide film each contain one of aluminum oxide and aluminum gallium oxide.

15. The semiconductor device according to claim 10, wherein the second metal oxide film and the third metal oxide film each contain one of gallium oxide and gallium aluminum oxide.

16. The semiconductor device according to claim 10, wherein the oxide semiconductor film contains indium, gallium, and oxygen.

17. The semiconductor device according to claim 10, wherein the oxide semiconductor film is surrounded by the second metal oxide film and the third metal oxide film.

18. The semiconductor device according to claim 1, wherein the semiconductor device is one selected from the group consisting of a laptop personal computer, a portable information terminal, an electronic book reader, a mobile phone, a digital video camera, and a television set.

19. The semiconductor device according to claim 10, wherein the semiconductor device is one selected from the group consisting of a laptop personal computer, a portable information terminal, an electronic book reader, a mobile phone, a digital video camera, and a television set.

20. The semiconductor device according to claim 10, wherein, in the cross-sectional view, the third metal oxide film contacts an entirety of the top and peripheral side surfaces of at least one of the source electrode and the drain electrode, and the second metal oxide film and the oxide semiconductor film contacts an entirety of the bottom surface of at least one of the source electrode and the drain electrode.

* * * * *